United States Patent
Kondo et al.

(10) Patent No.: US 6,726,803 B2
(45) Date of Patent: Apr. 27, 2004

(54) MULTI-SECTIONAL PLASMA GENERATOR WITH DISCHARGE GAPS BETWEEN MULTIPLE ELEMENTS FORMING A PLASMA DISCHARGE CAVITY

(75) Inventors: Kazuki Kondo, Wakayama (JP);
Michio Taniguchi, Hyogo (JP);
Shoichiro Minomo, Osaka (JP);
Shigeki Amadatsu, Hyogo (JP)

(73) Assignee: Daihen Corporation, Osaka (JP)

( * ) Notice: Subject to any disclaimer, the term of this patent is extended or adjusted under 35 U.S.C. 154(b) by 147 days.

(21) Appl. No.: 09/902,217

(22) Filed: Jul. 10, 2001

(65) Prior Publication Data

US 2002/0023589 A1 Feb. 28, 2002

(30) Foreign Application Priority Data

Jul. 11, 2000 (JP) ..................................... P2000-209463
Nov. 7, 2000 (JP) ..................................... P2000-339551

(51) Int. Cl.[7] .............................. C23C 16/00; C23F 1/00
(52) U.S. Cl. ................................ 156/345.43; 118/723 E
(58) Field of Search ................. 118/723 E, 723 ER, 118/723 R; 156/345.1, 345.43, 345.44, 345.45, 345.46, 345.47, 345.35

(56) References Cited

U.S. PATENT DOCUMENTS 4,403,167 A  *  9/1983 Maitland et al. ............ 313/632
5,587,207 A  * 12/1996 Gorokhovsky ............... 427/571

FOREIGN PATENT DOCUMENTS

| JP | 5-206072 | 8/1993 |
| JP | 5-242995 | 9/1993 |
| JP | 11-74098 | 3/1999 |

* cited by examiner

Primary Examiner—Luz Alejandro-Mulero
(74) Attorney, Agent, or Firm—Jordan and Hamburg LLP

(57) ABSTRACT

A discharge tube is assembled from three sections formed of metal. A first discharge tube element and a second discharge tube element are connected with an insulator for forming a discharging gap and vacuum-sealing interposed between connecting flanges of both discharge tube elements along with an O-ring. The first discharge tube element and a third discharge tube element and a third discharge tube element are connected in a similar manner, and a discharge gap is formed between adjacent discharge tube elements. A high-frequency power supply is connected to each discharge tube element. Respective discharge tube elements are provided with cooling medium flow paths separately each other.

13 Claims, 19 Drawing Sheets

FIG. 16A
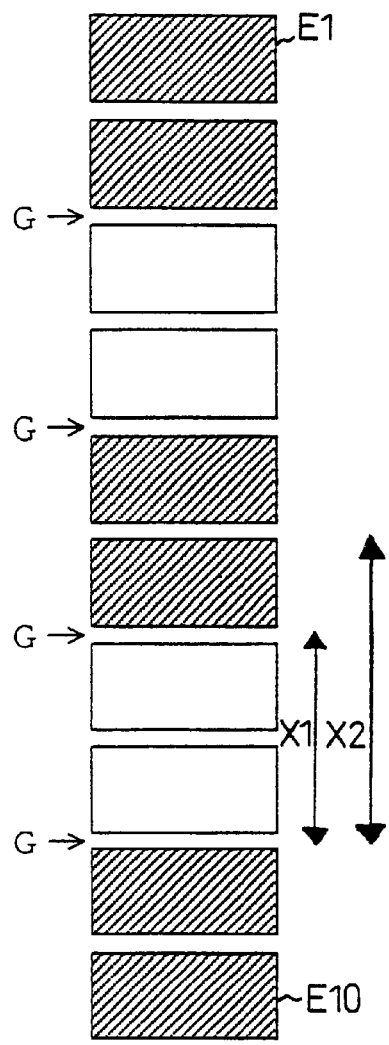
 A discharge tube element to be connected to a grounding terminal of a high-frequency power supply
 A discharge tube element to be connected to a high voltage terminal of a high-frequency power supply FIG. 16B
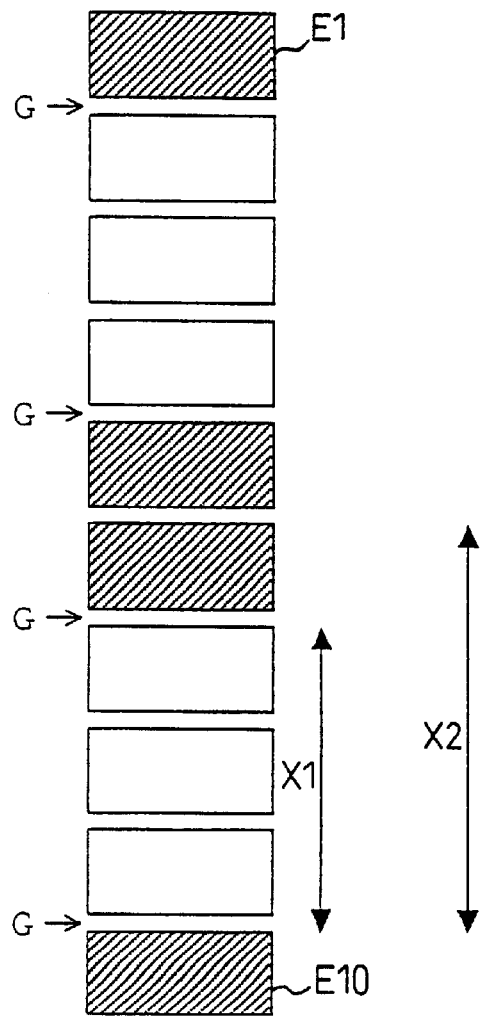
 A discharge tube element to be connected to a grounding terminal of a high-frequency power supply
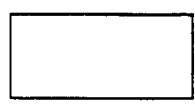 A discharge tube element to be connected to a high voltage terminal of a high-frequency power supply

US 6,726,803 B2

MULTI-SECTIONAL PLASMA GENERATOR WITH DISCHARGE GAPS BETWEEN MULTIPLE ELEMENTS FORMING A PLASMA DISCHARGE CAVITY

BACKGROUND OF THE INVENTION

The present invention relates principally to a plasma generating apparatus used in fabricating semiconductor devices, liquid crystal display panels and solar cells and particularly in processes of etching, ashing, thin film growth by chemical vapor deposition (CVD), sputtering, surface modification and chamber cleaning, and more specifically to a plasma generating apparatus of generating plasma by applying high-frequency power to gas for plasma generating, and particularly to technology for retarding thermal deterioration of a discharge tube. However, an application subject of a plasma generating apparatus in accordance with the present invention is not intended to be limited to the fabrication of semiconductor devices and is widely applicable for any desired objects.

In FIG. 18, reference numeral 101 indicates an insulating discharge tube, numeral 102 an insulating cooling medium flow tube, numeral 103 an upper flange for supporting a discharge tube, numeral 104 a lower flange for supporting a discharge tube, numeral 104a a cooling medium inlet, numeral 103a a cooling medium outlet, numeral 105 a gas introduction flange, numeral 105a a gas induction port for plasma, numeral 106 a flange for mounting to a device, numeral 106a a plasma discharge port, numeral 107 an induction coil, numeral 108 a high-frequency power supply, numerals 109 to 111 O-rings, numeral 112 a plasma generating space and numeral 113 a cooling medium flow space.

The outer periphery of the discharge tube 101 formed cylindrically is enveloped with the cooling medium flow tube 102 and the upper flange 103 for supporting a discharge tube is fitted externally to be fixed to the top end of the discharge tube 101 and the cooling medium flow tube 102 with O-rings 109, 110, respectively, interposed, and the lower flange 104 for supporting a discharge tube is fitted externally to be fixed to the bottom end of the discharge tube 101 and the cooling medium flow tube 102 with O-rings for vacuum-sealing 109, 110, respectively, interposed, and a double tube structure is constructed through such a fitting construction. In this double tube structure, the discharge tube 101 and the cooling medium flow tube 102 are coaxial, and the annular cooling medium flow space 113 is formed between both. The lower flange 104 for supporting a discharge tube is provided with the cooling medium inlet 104a communicating with the cooling medium flow space 113, and the upper flange 103 for supporting a discharge tube is provided with the cooling medium outlet 103a communicating with the cooling medium flow space 113. The gas introduction flange 105 which almost blocks the top end opening of the discharge tube 101 is made to abut on and fixed to the upper flange 103 for supporting a discharge tube with the O-rings 111 for vacuum-sealing interposed. The gas introduction port for plasma 105a is provided along a central axis of the gas introduction flange 105 in a state of communicating with the plasma generating space 112 of the discharge tube 101. The flange 106 for mounting to a device is made to abut on and fixed to the lower flange 104 for supporting a discharge tube in a state of communicating with the plasma generating space 112 of the discharge tube 101 with the O-rings 111 interposed. The induction coil 107 is wound on an outside of the outer cooling medium flow tube 102 constituting the double tube structure, and the induction coil 107 is connected to the high-frequency power supply 108. Further, an impedance matching device, not shown, is interposed between the induction coil 107 and the high-frequency power supply 108.

A plasma generating apparatus constructed as described above is used in a state of being attached to a plasma processing chamber, not shown, at the flange 106 for mounting to a device. Interior space of the plasma processing chamber and the plasma generating space 112 of the plasma generating apparatus is evacuated by evacuating the plasma processing chamber of air. Then, gas for plasma generation (discharging gas) is supplied from the gas introduction port for plasma 105a toward the plasma generating space 112 and high-frequency power is supplied to the induction coil 107 by actuating the high-frequency power supply 108, and a high-frequency electromagnetic field is generated in the plasma generating space 112. Simultaneously, a cooling medium is supplied from the cooling medium inlet 104a located on the lower side, is moved upward in the cooling medium flow space 113 and is discharged from the cooling medium outlet 103a.

The gas for plasma generation flows into the plasma generating space 112, and plasma ignition due to high-frequency discharge occurs in a small region of the flowing gas by action of the high-frequency electromagnetic field upon the gas for plasma generation. Resulting from the plasma ignition occured in a small region, plasma generation is spread almost across the whole of the gas flowing in the plasma generating space 112. The gas which is ionized to plasma in the plasma generating space 112 in this manner, i.e., plasma flows from the plasma discharge port 106a of the flange 106 for mounting to a device into the plasma processing chamber, not shown, and performs plasma processing, such as etching and ashing for semiconductor wafer and liquid crystal substrate, in the plasma processing chamber.

The plasma which is generated in the plasma generating space 112 becomes a high temperature. The discharge tube 101 forms the plasma generating space 112 which is a space for ionizing the gas for plasma generation being introduced from the gas introduction port for plasma 105a to plasma. Accordingly, the discharge tube 101 is raised in temperature due to contact with plasma of a high temperature. To limit the temperature rise within a predetermined range, heat exchange is conducted by flowing the cooling medium through the cooling medium flow space 113 surrounding the outer periphery of the discharge tube 101.

Though the discharge tube 101 is cooled as described above, it is inevitable that temperature difference occurs between the face of the inner circumference of the discharge tube 101, exposed to plasma of a high temperature, and the face of the outer periphery of the discharge tube 101, contacting with the cooling medium. Further, generated plasma of high temperature is localized in some cases, and so temperature difference is developed in the direction of a tube axis and in the circumferential direction in the discharge tube 101 as well. Thermal deformation is produced in the discharge tube 101 resulting from such temperature difference.

In a plasma generating apparatus of this sort of high-frequency discharge of inductive coupling type in which induction coils are arranged on an outer periphery of a discharge tube for a discharge tube for flowing the gas for plasma generation, the following conditions are required. That is, since a high-frequency electromagnetic field should be formed in the plasma generating space 112 of the discharge tube 101 by high-frequency power supplied from the induction coils 107 arranged outside of the discharge tube 101, the discharge tube 101 should be made from material other than a conductor, i.e.,an insulator (inductor) in order not to form electromagnetic shielding. The cooling medium flow tube 102 located at an outer periphery of the discharge tube 101 should also be of insulator. As such an insulator, there are, for instance, quartz, high purity alumina, aluminum nitride, glass and sapphire. Cooling medium flowing through the cooling medium flow space 113 is preferably a substance which does not absorb high-frequency power applied as far as possible, as well.

As described above, thermal deformation tends to be easily produced in the discharge tube 101, but since the discharge tube 101 is made from insulator, it has low thermal conductivity and the insulating discharge tube 101 experiences high temperature of the inner surface thereof and is apt to cause thermal deterioration in spite of cooling.

In addition, the discharge tube 101 has a large pressure difference between the outside atmosphere and the inside of the wall of the discharge tube since the plasma generating space 112 thereof is evacuated.

Further, though gas for plasma generation introduced into the plasma generating space 112 varies with a use and a condition, in some cases highly reactive plasma is generated depending on a gas property and there is possibility that the discharge tube 101 is subject to corrosion.

Further, an insulator is generally low in strength in comparison with metal material.

Due to such a high temperature, a temperature difference, a pressure difference and corrosion, there is a possibility that failures such as cracks and fractures are generated in the discharge tube 101, which is made from an insulator and relatively low in the strength, when in use for a long time. If the insulating discharge tube 101 should fail, and vacuum-sealed conditions are broken and it is not capable of producing a vacuum condition of the plasma generating space 112, plasma generation itself becomes impossible. And, if the insulating discharge tube 101 fails, the cooling medium escapes and the escaped cooling medium flows into a plasma processing chamber unexpectedly and possibly contaminates substances to be processed such as semiconductor wafer.

There is also a plasma generating apparatus of a capacitive coupling type other than such an inductive coupling type. This apparatus is one in which a pair of curved-shaped electrodes are opposed on a face of the outer periphery of a discharge tube made from an insulator such as glass, and high-frequency power is applied to both electrodes. A high-frequency electromagnetic field is produced in a plasma generating space within a discharge tube, discharge is developed by ionizing gas for plasma generation, and therefore plasma is generated. Also in this case, as the discharge tube, an insulating discharge tube is used, and therefore there is the same problem as the above.

Further, the discharge tube 101 made from insulator prepared with quartz, high purity alumina, aluminum nitride, glass and sapphire is considerably high in its initial cost.

SUMMARY OF THE INVENTION

Accordingly, it is a principal object to provide a plasma generating apparatus to prevent failure such as cracks and fractures and leakage of cooling medium due to thermal deterioration of a discharge tube.

The present invention of a plasma generating apparatus intended to attain the object described above uses metal material as component material of a discharge tube in place of insulator of prior art. The reason for this is that metal material has a higher resistance against heat and a higher physical strength compared with insulator.

However, it is insufficient only to replace the material. The reason for this is that when the whole discharge tube has been simply composed with metal material, high-frequency power generated by an induction coil located on an outer periphery of a discharge tube cannot enter into the interior of metal material, i.e., a discharge tube due to the effect of electromagnetic shielding by metal material, i.e., a conductor. In other words, high-frequency power cannot be provided from an induction coil located on an outer periphery of a discharge tube to a plasma generating space within a discharge tube.

There is a plasma generating apparatus of a capacitive coupling type, rather than an inductive coupling type, utilizing high-frequency power. In the capacitive coupling type, when the whole discharge tube is composed of metal material, there is a problem of how to construct and to locate a pair of electrodes. When a pair of electrodes are located within a discharge tube of metal material, each electrode is required to be located in a state of being insulated and isolated from a discharge tube of metal material. When a pair of electrodes are located within a discharge tube, these electrodes become an obstruction against the flow of gas/plasma. Further, since a pair of electrodes is required, this leads to complication of the structure and increase in cost.

Thus, the object cannot be attained by a simple idea that component material of a discharge tube is only replaced with metal material.

Consequently, in the present invention, when a discharge tube is composed of metal material which is excellent both in thermal resistance and in physical strength compared to an insulator, it is noted that the discharge tube is a conductor and it is functionally the same as an electrode in the fact of being a conductor. That is, it is feasible to use a discharge tube both as itself and as an electrode, conversely, the feasibility of using an electrode both as itself and as a discharge tube exists.

In view of the above, a plasma generating apparatus of a first embodiment of the present invention is one, wherein each discharge tube element, of a discharge tube having a plurality of sections in a direction of a tube axis, is fabricated from metal materials and the discharge tube elements of metal material are connected hermetically to each other with an insulator interposed and a discharge gap is formed between the discharge tube elements. The foregoing plasma generating apparatus is constructed so to enable plasma ignition at foregoing discharge gap by applying high-frequency power.

Accordingly, a discharge tube is obtained by dividing a discharge tube at one point or a plurality of points in the direction of a tube axis thereof by cutting across the direction of the tube axis. The number of the discharge tube elements is two or more. A plurality of the discharge tube elements are lined in the direction of the tube axis and combined, to thereby construct a discharge tube. Each individual discharge tube element is fabricated from metal materials. When a plurality of the discharge tube elements of metal material are lined in the direction of the tube axis and combined, connecting the discharge tube elements to each other in a state of direct contacting causes the whole of the discharge tube obtained as a result of being connected to become a single conductor, so that the discharge tube cannot be used both as itself and as an electrode. Further, there is also a problem in vacuum-sealing. Accordingly, each of a plurality of the discharge tube element of metal material is connected to each other with an insulator interposed between both of the discharge tube elements. This insulator is interposed to form a discharge gap between both of them. In other words, each discharge tube element is used both as itself and as a discharge electrode, and the insulator is what has the function of securing a discharge gap between the discharge tube elements as the electrode. Moreover, an insulator also has a function of connecting hermetically discharge tube elements to each other. Yet further, when it is difficult to secure the hermeticity only with the insulator, sealing materials such as an O-ring are used.

Further, as a metal material which composes the discharge tube element, any material may be used in principle, but a material which produces less ill effect on substances to be processed, such as semiconductor devices, may be preferably used. In other words, the reason for this is that it cannot be said that there is not a possibility that a face of the inner circumference of a discharge tube element of metal material is subjected to sputtering by plasma, and the sputtered particles flow out from a plasma generating space as conductive material. In this sense, aluminum is preferable. Further, aluminum to which anodic oxidation treatment is applied is preferred to prevent corrosion by plasma. It is better to avoid using stainless steel, copper or the like as there is a possibility that these materials cause contamination. However, stainless steel, copper or the like may be used in some conditions.

Moreover, as an insulator for forming a discharging gap, any material may be used in principle, but an inorganic insulator of high purity, such as high purity alumina, sapphire, quartz and aluminum nitride, is preferable considering the heat resistance. Alternatively, polyimide, tetrafluoroethylene (Teflon (trademark of Du Pont Corp.)), polyethylene may also be used.

With respect to high-frequency power, its frequency is not particularly limited. In the concerned technical field, normally, high-frequency is taken as several hundreds kHz or greater. In a narrow sense, high-frequency is taken as 10 to 100 MHz in some cases. Also, a microwave is taken as 1 GHz or greater and, in a narrow sense, it is taken as about $10^3$ to $10^4$ MHz (2.45 GHz is well known in magnetron applications) in some cases. In the case of a microwave discharge, it is common to introduce a microwave using a waveguide. Though there are such technical notions generally accepted as described above, in the present invention, high-frequency power may include microwave power, and it is not necessary to be particular about the frequency if plasma ignition and plasma generation are possible.

A set of the discharge tube elements connected to each other as described above may be only a couple (the number of elements is two), two couples (the number of elements is three) or more (the number of elements is four or more).

In either case, by connecting each of a plurality of discharge tube elements of metal material to each other as described above, a discharge tube is constructed, and, in this discharge tube, almost the whole thereof becomes a tube for forming a plasma generating space for flowing gas for plasma generation and generated plasma while containing them in a necessary space, and simultaneously discharge tube elements adjacent to the direction of the tube axis serve as a pair of electrodes. That is, the discharge tube elements, respectively, have two functions different from those of each other. Consequently, it becomes possible to perform plasma ignition at the discharge gap between both discharge tube elements by applying high-frequency power to adjacent discharge tube elements.

Operation in accordance with the first embodiment of the present invention is as follows. Since a discharge tube consisting of a combination of a plurality of discharge tube elements of metal material is substantially formed of metal material, its physical strength is high compared with that of an insulating discharge tube in the case of prior art. The thermal strength is also high compared with that of an insulating discharge tube. Cooling properties are also good. Accordingly, even in a condition of being exposed to plasma of a high temperature, thermal deterioration is less. Further, the discharge tube element is not broken as distinct from an insulating discharge tube even though a large pressure is applied to the wall of the discharge tube element by a pressure difference since the interior of the discharge tube element is evacuated of air. Moreover, even when highly reactive plasma is generated, a discharge tube of metal material experiences less corrosion compared with an insulating discharge tube in the case of prior art. Yet further, this results in the extension of life and leads to reduction of maintenance. Still further, since plasma ignition is performed at a narrow gap, such as a discharge gap by applying high-frequency power, plasma ignition performance is good and plasma generation can be favorably realized. In addition, the discharge tube which is substantially of metal material almost as a whole becomes low in initial cost compared with a conventional insulating discharge tube, as well.

A plasma generating apparatus of a second embodiment of the present invention, has as a plurality of foregoing discharge tube elements of metal material, includes a first discharge tube element positioned at the middle, a second discharge tube element having a gas induction port for plasma and a third discharge tube element having a plasma discharge port, wherein these respective discharge tube elements are connected hermetically to each other in the direction of a tube axis. This corresponds to a more specific description of the first embodiment of the present invention described above. Here, any aspects of a gas introduction port for plasma and a plasma discharge port may be used. The discharge tube to be assembled from three sections. A discharge tube is divided into three discharge tube elements by being divided at two locations in the direction of a tube axis. There are a first discharge tube element at the middle, a second discharge tube element on the upstream side of a flow path, which has a gas introduction port for plasma, and a third discharge tube element on the downstream side of a flow path, which has a plasma discharge port.

An advantage the discharge tube assembled from divided three sections is as follows. Functions of a discharge tube can be separated into three functions, that is, a function introducing gas for plasma generation from the outside, ionizing gas to plasma by igniting gas in a plasma generating space, and supplying the generated plasma to a plasma processing chamber. Corresponding to the functions, three discharge tube elements are prepared, and thereby it becomes possible to adopt a constitution suitable for each function. In addition, discharge gaps are located at two positions of the upstream and the downstream of a flow path, and the performance of plasma ignition becomes high when it is arranged to perform plasma ignition at both discharge gaps. Plasma ignition is not necessarily required to be performed at both discharge gaps, and it might be performed at either discharge gap.

A plasma generating apparatus of a third embodiment of the present invention the second embodiment of the present invention described above, wherein, as the relation of connection between the foregoing first to third discharge tube elements and a high-frequency power supply supplying the foregoing high-frequency power, a high voltage terminal of the foregoing high-frequency power supply is connected to the foregoing middle first discharge tube element and a grounding terminal of the foregoing high-frequency power supply is connected to the foregoing second and third discharge tube elements on both sides. This corresponds to a more specific description of the second embodiment of the present invention described above.

An upstream second discharge tube element communicates with an external gas piping and gas cylinder through its gas introduction port for plasma. Also, a downstream third discharge tube element communicates with an external plasma processing chamber at its plasma discharge port. It is a problem from a safety standpoint to apply a high voltage terminal of the high-frequency power supply to a gas piping and a gas cylinder. And, it is also a problem from a safety standpoint to apply a high voltage terminal of the high-frequency power supply to a plasma processing chamber. In the latter, there are two safety problems of products and humans. Therefore, safety is secured by connecting a grounding terminal of the high-frequency power supply to both of the second and the third discharge tube elements on both sides. When a high voltage terminal of the high-frequency power supply is connected to the first discharge tube element at the middle, the first discharge tube element functions intrinsically as a common high voltage for both of a second discharge tube element and a third discharge tube element, and further ensures the respective levels of a high-frequency power (voltage) applied are similar.

A plasma generating apparatus of a fourth embodiment of the present invention, includes the first embodiment described above, has a plurality of foregoing discharge tube elements of metal material, includes a first discharge tube element positioned at the middle, an upstream second discharge tube element having a gas introduction port for plasma, a downstream third discharge tube element having a plasma discharge port, an intermediate fourth discharge tube element positioned between foregoing middle first discharge tube element and foregoing upstream second discharge tube element and an intermediate fifth discharge tube element positioned between the foregoing middle first discharge tube element and foregoing downstream third discharge tube element, wherein these respective discharge tube elements are connected hermetically to each other in the direction of a tube axis.

Since a mean free path of an electron becomes short as the gas pressure of a plasma generating space increases, it becomes difficult to spread plasma generation across the whole of the plasma generating space widely.

The distance traveled by a particle from one collision to next collision is referred to as a free path, and the average value thereof is referred to as a mean free path. A mean free path is inversely proportional to the gas pressure at a constant temperature. That is, the higher the gas pressure is, the shorter a mean free path of an electron is. Under the high gas pressure, since a mean free path of an electron becomes short, plasma generation will be limited to the vicinity of a discharge gap. Since, in a discharge tube assembled from three sections, the length of the middle first discharge tube element in the direction of tube axis becomes large in comparison with an inside diameter of the tube, a linkage between a plasma region centered on a discharge gap between the first discharge tube element and the second discharge tube element and a plasma region centered on a discharge gap between the first discharge tube element and the third discharge tube element is lost, and plasma results in not spreading across the whole of the plasma generating space of the discharge tube. When plasma regions are in conditions of losing such linkage, the efficiency of plasma generation becomes extremely low since there is a definite limit on an amount of plasma generated and an increase of plasma generation cannot be expected even though the power applied from a high-frequency power supply is increased.

Thus, the fourth embodiment of the present invention allows plasma generation efficiency to be high even in a condition of a high gas pressure which causes a mean free path of an electron to shorten. That is, a feature of the present invention is a discharge tube assembled from five sections. Compared with a discharge tube assembled from three sections, it can be said that by dividing the middle first discharge tube element further at the two points in the direction of a tube axis, two discharge tube elements of a fourth discharge tube element and a fifth discharge tube element are additionally made in addition to the first discharge tube element newly made and therefore a discharge tube is divided into five discharge tube elements on the whole including the upstream second discharge tube element and the downstream third discharge tube element. As a result, the distance between two discharge gaps is divided into three smaller sections in this invention. Dividing into three may include equal three sections and also unequal. Briefly speaking, the distance between discharge gaps adjacent to the direction of a tube axis is sufficiently shortened.

Accordingly, since gas for plasma generation is in a condition of a high gas pressure, a mean free path of an electron is short and four plasma regions, centered on the first to the fourth discharge gaps, respectively, in the direction of a tube axis is short in respective holding ranges of the direction of a tube axis, and plasma regions adjacent to the direction of a tube axis link together because the distance between discharge gaps is sufficiently shortened as described above. Therefore, a chain reaction of plasma generation is advanced and a plasma region is spread across the whole of the plasma generating space, and four plasma regions are combined into one. Even in a condition of a high gas pressure, an amount of plasma generated increases, and therefore it is possible to raise the efficiency of power supply and to enhance the efficiency of plasma generation.

A plasma generating apparatus of the fifth embodiment of the present invention includes the fourth embodiment of the present invention described above, wherein, as the relation of connection between the foregoing first to fifth discharge tube elements and a high-frequency power supply supplying the foregoing high-frequency power, a grounding terminal of the foregoing high-frequency power supply is connected to the foregoing middle first discharge tube element, the foregoing upstream second discharge tube element and the foregoing downstream third discharge tube element, and a high voltage terminal of the foregoing high-frequency power supply is connected to the foregoing intermediate fourth discharge tube element and the foregoing intermediate fifth discharge tube element.

Operation in accordance with the fifth embodiment of the present invention is as follows. Safety is secured by connecting a grounding terminal of a high-frequency power supply to an upstream second discharge tube element communicating with a external gas piping and gas cylinder through a gas induction port for plasma, a downstream third discharge tube element communicating with an external plasma processing chamber at a plasma discharge port and a middle first discharge tube element being separated by one intermediate element from the second and the third elements, respectively. The discharge tube element is constructed rationally in such a way that the levels of a high-frequency power (voltage) applied are similar to all of discharge gaps by connecting a high voltage terminal of the high-frequency power supply commonly to the intermediate fourth discharge tube element and the intermediate fifth discharge tube element.

A plasma generating apparatus of a sixth embodiment of the present invention includes the first embodiment described above, wherein the number of a plurality of foregoing discharge tube elements of metal material is an odd number.

Since a mean free path of an electron becomes short as gas pressure of a plasma generating space increases, it becomes difficult to spread plasma generation across the whole of the plasma generating space. Therefore, in the above fourth embodiment of the present invention, the distance between discharge gaps adjacent to the direction of a tube axis is shortened by making a discharge tube assembled from five sections and the efficiency of plasma generation is enhanced.

However, when the distance between discharge gaps is long even in a discharge tube assembled from five sections, the distance between discharge gaps may also be shortened by increasing further the number of division of the discharge tube to enhance the plasma generation efficiency.

In this case, as described later, it is preferred from a safety standpoint that the number of discharge tube elements is made an odd number by dividing a discharge tube into odd sections.

An advantage in accordance with the sixth embodiment of the present invention is as follows. Since the distance between discharge gaps can be set by finely adjusting, it is possible to set an optimal distance between discharge gaps depending on the conditions of plasma generation such as kinds of gas desired to be ionized to plasma, pressure of gas, applied electric power (voltage) and an applied frequency. And, when the number of division of a discharge tube is fixed, the distance between discharge gaps is lengthened in the case of a large size of a plasma generating apparatus, but, in accordance with the sixth embodiment of the present invention, an appropriate distance between discharge gaps may be set even in the case of a large size of a plasma generating apparatus.

A plasma generating apparatus of seventh embodiment of the present invention includes the sixth, wherein, as the relation of connection between the foregoing odd discharge tube element and a high-frequency power supply supplying the foregoing high-frequency power, a grounding terminal and a high voltage terminal of the foregoing high-frequency power supply are connected alternately to the foregoing odd discharge tube elements under the condition of connection that a grounding terminal of the foregoing high-frequency power supply is connected to an upstream second discharge tube element having a gas induction port for plasma and a downstream third discharge tube element having a plasma discharge port. This corresponds to a more specific description of the sixth.

When a grounding terminal and a high voltage terminal of a high-frequency power supply are connected alternately to a discharge tube element, in increasing the number of discharge tube elements, the levels applied to an upstream second discharge tube element and a downstream third discharge tube element vary depending on whether the number of discharge tube elements is an odd number or an even number.

That is, the levels applied of an upstream second discharge tube element differs from that of a downstream third discharge tube element when the number of discharge tube elements is an even number. And, the levels applied of an upstream second discharge tube element is similar to that of a downstream third discharge tube element when the number of discharge tube elements is an odd number.

Here, as described above, it is preferred to connect a grounding terminal of a high-frequency power supply to an upstream second discharge tube element and a downstream third discharge tube element. Therefore, the number of discharge tube elements is an odd number and connection relations as described above are taken.

A plasma generating apparatus of an eighth embodiment of the present invention includes the first embodiment, wherein the number of foregoing discharge gaps capable of plasma ignition is an even number.

Making the number of discharge gaps an even number requires basically to divide a discharge tube into an odd number and to make the number of discharge tube elements an odd number (taking the number of discharge gaps as n, the number of discharge tube elements becomes n+1).

However, when the length of a discharge tube element in the direction of a tube axis is shorter than the distance between discharge gaps required to link plasma regions into one, a distance between discharge gaps which is capable of plasma ignition may be substantially lengthened not by connecting a grounding terminal and a high voltage terminal of a high-frequency power supply alternately to a plurality of discharge tube elements, but by connecting a high-frequency power supply to a discharge tube element in such a way that the levels of a high-frequency power (voltage) applied from a high-frequency power supply are the same on adjacent two or more discharge tube elements.

That is, there is a location in which a grounding terminal or a high voltage terminal of a high-frequency power supply is connected to adjacent two or more discharge tube elements sequentially, and a discharge gap located at this location will not conduct plasma ignition since the levels of a high-frequency power (voltage) applied to the adjacent discharge tube elements are the same.

Hence, the gap is not a discharge gap. Therefore, a distance between discharge gaps capable of plasma ignition may be substantially lengthened.

On the one hand, it is preferred from a safety standpoint to connect a grounding terminal of a high-frequency power supply to an upstream second discharge tube element and a downstream third discharge tube element.

Therefore, it becomes a criterion that the number of discharge gaps capable of plasma ignition is an even number.

In this case, even though a grounding terminal of the high-frequency power supply is connected to an upstream second discharge tube element having a gas induction port for plasma and a downstream third discharge tube element having a plasma discharge port, the number of discharge tube elements is not necessarily an odd number and may be an even number.

An advantage in accordance with the eighth embodiment of the present invention is as follows.

The distance between discharge gaps required to link plasma regions into one varies with conditions of plasma generation such as kinds of gas, pressure of gas, applied electric power (voltage) and an applied frequency. Consequently, since it is required to set the length of a discharge tube element in the direction of a tube axis in conformity with the conditions of plasma generation, commonality of a discharge tube element is difficult.

A discharge tube element has been fabricated, of which the length in the direction of a tube axis is shorter than the distance between discharge gaps required to link plasma regions into one, and by contriving the order of connection of a grounding terminal or a high voltage terminal of a high-frequency power supply to be connected to each of a plurality of discharge tube elements to provide a distance between discharge gaps in conformity with the conditions of plasma generation, a distance between discharge gaps capable of plasma ignition may be set. Thus, commonality of a discharge tube element becomes possible.

Particularly, this manner is effective when a large number of discharge tube elements are used in the case of a large size of a plasma generating apparatus.

A plasma generating apparatus of a ninth embodiment of the present invention includes the first to the eighth embodiments, wherein connection between the foregoing discharge tube elements to each other lets flanges, which are directed radially outward, integrally conjoined to each discharge tube element to oppose to each other and the foregoing insulator is interposed between the opposite flanges.

Operation in accordance with the ninth embodiment of the present invention is as follows. Though a discharge tube is divided in the direction of a tube axis and a discharge tube is constructed by connecting the discharge tube elements resulting from that division to each other, a discharge tube is brought into an ultra-low pressure condition, even though temporarily, by evacuating. Accordingly, dividing a discharge tube becomes a significant problem on vacuum-sealing. A performance of vacuum-sealing has to be surely secured also in dividing. There is a structure of flange for this purpose. In each discharge tube element, a flange extending radially outward is integrally conjoined to the corresponding location connecting each discharge tube element to another discharge tube element. A dimension of the circumferential direction differs from that of the direction of a tube axis in the directivity. Accordingly, it is possible to construct a flange with sufficient size and area corresponding to the requirements. The requirements are the performance of vacuum-sealing and the strength of connection. A discharge tube element is connected to each other at the flanges opposed to each other with an insulator interposed between the flanges. When an insulator is supported by sandwiching it between the flanges with required area, performance of vacuum-sealing may be sufficiently secured. In addition, an arrangement of a seal material such as an O-ring also becomes easy. And, it also becomes possible to make the strength of connection sufficiently high. And, a discharge gap is formed by interposing an insulator, and, by setting sufficient area for the insulator interposed, it is possible to make the dimensional accuracy of a discharge gap sufficiently high since the deformation due to the external stress becomes less. This is extremely significant for plasma ignition.

In a plasma generating apparatus of a tenth embodiment of the present invention includes the above first to ninth embodiments, the foregoing respective discharge tube elements are provided with cooling medium flow paths separately each other.

Operation in accordance with the tenth embodiment of the present invention is as follows. A discharge tube is excellent in heat resistance compared with that of an insulating discharge tube in the case of prior art since respective discharge tube elements composing the discharge tube are formed of metal material. Even then, since the generated plasma is at a high temperature, it is preferred to cool a discharge tube. Though it is conceivable to cool with air, it is more effective to cool using a liquid cooling medium. Considering leakage at a portion of a connection between discharge tube elements, it is preferred to provide an individual cooling medium flow path for each discharge tube element. As for leakage at a circumferential surface of a discharge tube, since this discharge tube is formed of metal material and resistant to failures, such as cracks and fractures resulting from thermal detrioration as distinct from prior art using an insulating discharge tube, leakage of cooling medium at a circumferential surface of a discharge tube does not occur in principle. Thereby, a discharge tube composed of a plurality of elements allows preventing the leakage of cooling medium. And, with respect to kinds of cooling medium, it has been thought in the prior art that a substance which does not absorb high-frequency power as far as possible, for example, an expensive one such as deionized water, is preferable, but, in the present invention, there is not such a limit, and relatively inexpensive cooling medium available may be used and this reduces the running cost.

A plasma generating apparatus of an eleventh embodiment of the present invention includes the above first to ninth embodiments of the present invention, wherein a part of a plurality of the foregoing discharge tube elements is provided with cooling medium flow paths and the rest of the discharge tube elements are cooled with air.

Operation in accordance with the eleventh embodiment of the present invention is as follows. As for cooling of each discharge tube element, it is preferred to provide an individual cooling medium flow path for each discharge tube element like the above tenth aspect of the present invention, but when it is possible to fabricate a discharge tube element which can stand the heat of plasma generated even though a part of discharge tube elements is cooled with air without providing all of respective discharge tube elements with cooling medium flow, it becomes possible to provide only a part of discharge tube elements with cool medium flow paths and cooling the rest discharge tube elements with air. Such a constitution reduces the number of cooling medium flow paths, the initial cost and the running cost of a plasma generating apparatus including the reduction of equipment of piping system and consumption of a flowing cooling medium and simplifies constitution of a discharge tube.

A plasma generating apparatus of a twelfth embodiment of the present invention includes the first to eleventh embodiments of the present invention described above, wherein, in a relation between the foregoing discharge gap and the foregoing insulator, a gap between the foregoing discharge tube elements, connecting to form the foregoing discharge gap, is formed by connecting between a part along the direction perpendicular to the direction of a tube axis of the foregoing discharge tube element and a part along the direction of a tube axis of the foregoing discharge tube element.

Operation in accordance with the twelfth embodiment of the present invention is as follows. Though a discharge gap is constructed by connecting a discharge tube element to each other in a state of supporting an insulator by sandwiching it, a face of the inner circumference of the insulator is communicated with an inner plasma generating space through the discharge gap. Accordingly, in a condition of containing a conductive substance in plasma, there is possibility that the conductive substance adheres to a face of the inner circumference of an insulator across a discharge gap. An insulator has a role isolating a pair of discharge tube elements and is supported by being sandwiched between a pair of discharge tube elements. Accordingly, a face of the inner circumference of an insulator is physically and mechanically connected to both discharge tube elements apart from electrically. Accordingly, when the conductive substance adheres to a face of the inner circumference of the insulator, there is a possibility that both discharge tube elements of metal material are short circuited through the conductive substance. Occurrence of a short circuit obstructs plasma ignition itself, and reliability of plasma generation becomes a problem.

A gap of both discharge tube elements connected to a discharge gap is bent. The manner of bending may be inflecting or curving. Briefly speaking, it might be well that a gap takes aspects of connecting between a part along the direction perpendicular to the direction of a tube axis and a part along the direction of a tube axis of a discharge tube elements, respectively. Each part may be connected to each other orthogonally or through the medium of a curved portion with a certain curvature or tapered portion. Even if there is an event that conductive substance in a plasma generating space plunges into the rear gap of a discharge gap due to collision against another particle, there is a tendency that the path is along the direction perpendicular to the direction of a tube axis. If a conductive substance adheres at the rear end of the rear gap of a discharge gap, a part along the direction of a tube axis still remains an insulator. A flying conductive substance resists colliding against the part along the direction of a tube axis, the adhesion and deposition are retarded. Thus, by synergy between that there is a spacial allowance and resistance to collision, it is possible to prevent a short circuit through a conductive substance and reliability of a plasma generating apparatus may be enhanced.

A plasma generating apparatus of a thirteenth embodiment of the present invention includes the above first to twelfth embodiments of the present invention, wherein an insulator interposed between foregoing discharge tube elements is separated into an outer body portion for vacuum-sealing and an inner protecting portion exposed to plasma.

Operation in accordance with the thirteenth embodiment of the present invention is as follows. Since an insulator for forming a discharge gap is exposed directly to the plasma of a high temperature and the vicinity of the insulator is not cooled directly, it is subject to local overheating and apt to cause the thermal deformation, and there is a possibility that the thermal deformation produces the failure such as cracks and fractures in the insulator to cause the vacuum break. Thus, an insulator is separated into an inner protecting portion and an outer body portion, and a body portion is provided with a function of vacuum-sealing, and a protecting portion is made a portion for allowing the crack and fracture. Even if cracks and fractures develop due to an exposure to plasma, the protecting portion prevents the crack and fracture of the protecting portion from communicating with the body portion. That is, the protecting portion is made to bear the role of a breakwater against thermal deterioration, made victims in thermal deterioration and made to protect the rear body portion. Further a body portion and a protecting portion may be spatially separated or contacted. It is preferred for limiting the communicating to keep them separated a little. If it is possible to substantially prevent failure such as the crack and fracture from communicating, a substance which is integrally connected to a body portion through the medium of a narrow part may also be used. Since the body portions are free from thermal deterioration, the performance of vacuum-sealing is secured over an extended time period and the reliability of a plasma generating apparatus may be enhanced.

BRIEF DESCRIPTION OF THE DRAWINGS

These and other objects as well as advantages of the invention will become clear by the following description of preferred embodiments of the invention with reference to the accompanying drawings, wherein:

FIG. 16A and FIG. 16B are conceptual views illustrating constitutions of a discharge tube element in a plasma generating apparatus of the seventh preferred embodiment;

In all these Figures, like components are indicated by the same numerals.

DETAILED DESCRIPTION OF THE INVENTION

Thereinafter, the preferred embodiments of the present invention will be described with reference to the drawings.

Figure 1:
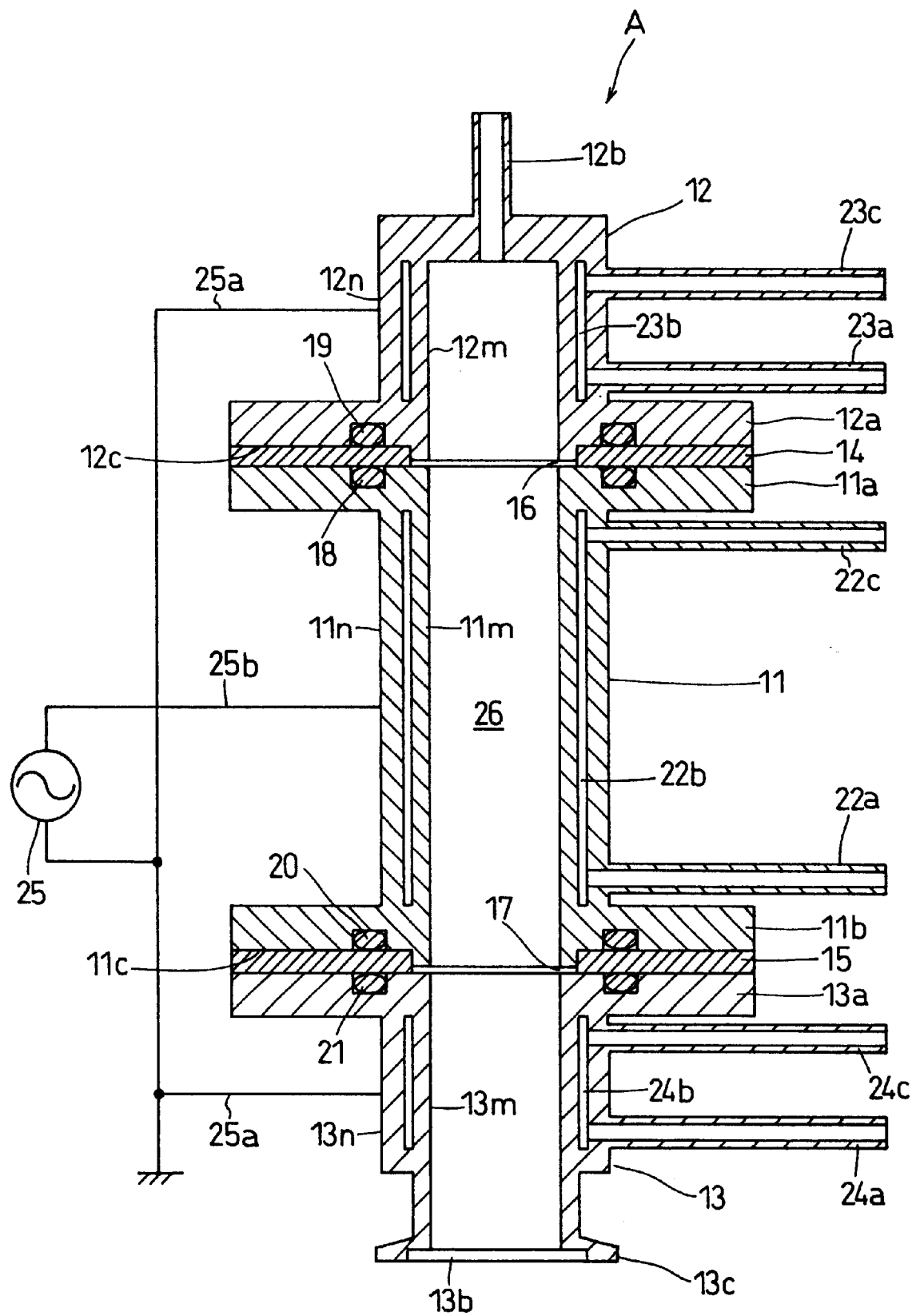
FIG. 1 is a vertical sectional view illustrating schematically a structure of a plasma generating apparatus of a high-frequency discharge type of the first preferred embodiment of the present invention.
Figure 2:
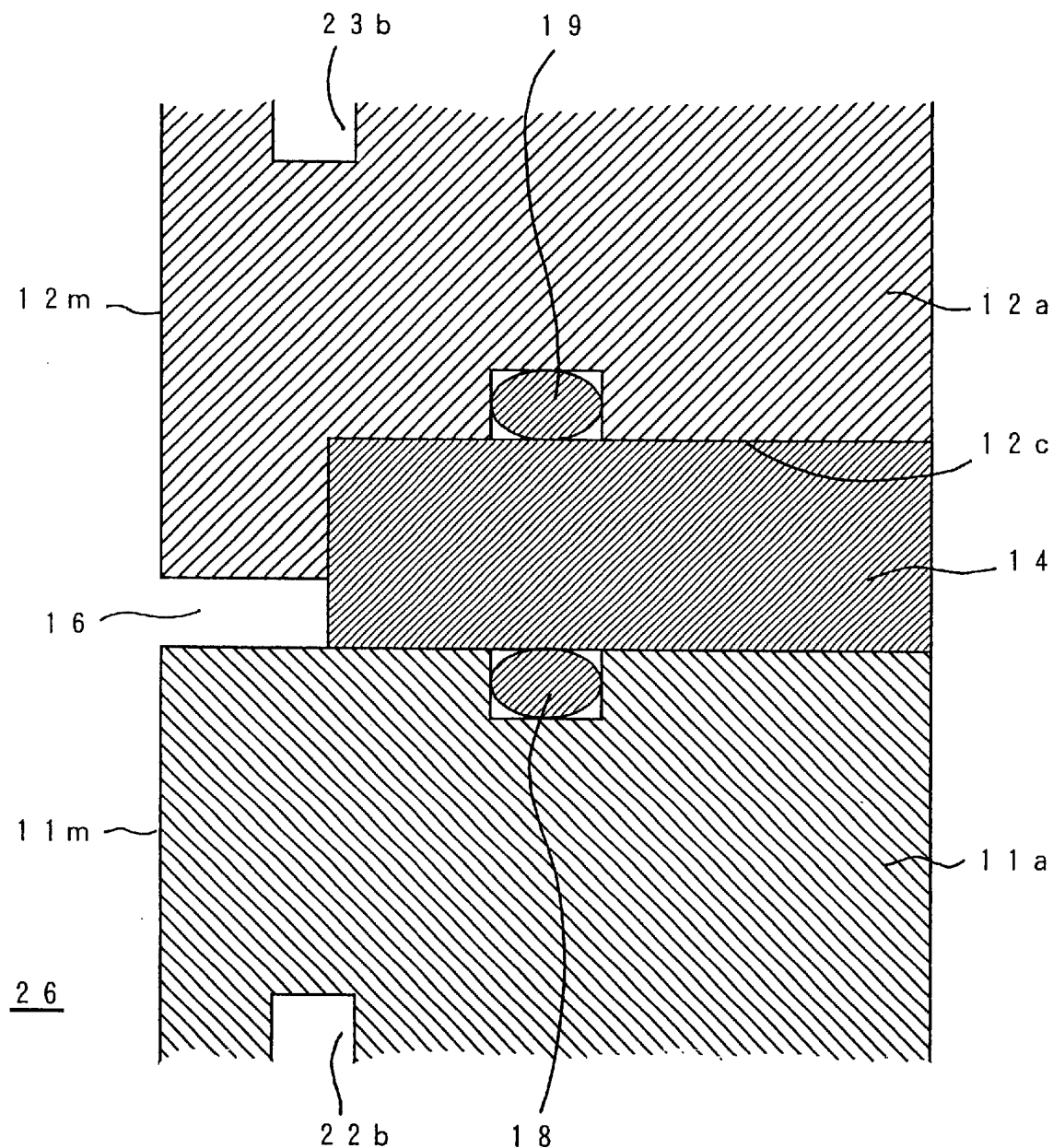
FIG. 2 is an enlarged sectional view illustrating under magnification the vicinity of a discharge gap which is the essential part of a plasma generating apparatus of the first preferred embodiment.

FIG. 1 is a vertical sectional view illustrating schematically a structure of a plasma generating apparatus of high-frequency discharge type of the first preferred embodiment of the present invention and FIG. 2 is an enlarged sectional view illustrating the vicinity of a discharge gap part under magnification. In FIG. 1 and FIG. 2, reference numeral 11 indicates a first cylindrical discharge tube element formed of metal material, which is positioned at the middle of the vertical direction, numeral 12 a second cylindrical discharge tube element formed of metal material, which is positioned at the upper side of the vertical direction, numeral 13 a third cylindrical discharge tube element formed of metal material, which is positioned at the lower side of the vertical direction, numerals 11a, 11b connecting flanges conjoined integrally to top end and bottom end portions of a middle first discharge tube element 11, numeral 12a a connecting flange conjoined integrally to bottom end of a second discharge tube element 12, numeral 13a a connecting flange conjoined integrally to a top end of a third discharge tube element 13, numerals 14, 15 insulators for forming a discharge gap and vacuum-sealing, numerals 16, 17 discharge gaps, numeral 12b a gas introduction port, numeral 13b a plasma discharge port, numeral 13c a flange for mounting to a device, numerals 18, 19, 20, 21 O-rings, numerals 22a, 23a, 24a cooling medium flow inlet tubes, numerals 22b, 23b, 24b cooling medium flow path of water jacket type, numerals 22c, 23c, 24c cooling medium flow outlet tubes and numeral 25 a high-frequency power supply. In addition, as for a configuration of discharge tube element, a tubiform discharge tube element may be used, and it is not required to stick to a cylindrical shape and a tube with a cross section of polygon may also be used.

In the first discharge tube element 11, its cylindrical portion is configured in such a way that a cooling medium flow path 22b is formed between an inner tube portion 11m and an outer tube portion 11n which are coaxial to each other, and a cooling medium flow inlet tube 22a and a cooling medium flow outlet tube 22c are connected to a bottom end and a top end, respectively, of the outer tube portion 11n in a state of communicating with a cooling medium flow path 22b. Similarly, in a second discharge tube element 12, its cylindrical portion is configured in such a way that a cooling medium flow path 23b is formed between an inner tube portion 12m and an outer tube portion 12n which are coaxial to each other, and a cooling medium flow inlet tube 23a and a cooling medium flow outlet tube 23c are connected to a bottom end and a top end, respectively, of an outer tube portion 12n in a state of communicating with a cooling medium flow path 23b. And, in a third discharge tube element 13, its cylindrical portion is configured in such a way that a cooling medium flow path 24b is formed between an inner tube portion 13m and an outer tube portion 13n which are coaxial to each other, and a cooling medium flow inlet tube 24a and a cooling medium flow outlet tube 24c are connected to a bottom end and a top end, respectively, of an outer tube portion 13n in a state of communicating with a cooling medium flow path 24b. The inner tube portion 11m and the outer tube portion 11n are fabricated separately and the discharge tube element 11 is constructed by conjoining the outer tube portion 11n to the inner tube portion 11m integrally through welding or brazing. In this manner, a cooling medium flow path 22b of the water jacket type having a large heat exchanging surface is formed.

An annular groove is formed at an upper face of the connecting flange 11a conjoined integrally to a top end portion of the first discharge tube element 11, and an O-ring 18 is fitted into the annular groove, and an O-ring 20 is fitted into the annular groove formed at a lower face of the connecting flange 11b conjoined integrally to a bottom end portion of the first discharge tube element 11. An O-ring 19 is fitted into the annular groove formed at a lower face of a connecting flange 12a conjoined integrally to a bottom end portion of a second discharge tube element 12. An O-ring 21 is fitted into the annular groove formed at an upper face of a connecting flange 13a conjoined integrally to a top end portion of a third discharge tube element 13.

The connecting flange 11a of a top end side of the first discharge tube element 11 and a connecting flange 12a of a bottom end portion of a second discharge tube element 12 support an insulator 14 for forming a discharge gap and vacuum-sealing by sandwiching it between both connecting flanges, and furthermore the first discharge tube element 11 is connected coaxially to a second discharge tube element 12 with respective O-rings 18, 19 in close contact with an insulator 14 and with a discharge gap 16 formed between a top end face of an inner tube portion 11m and a bottom end face of the inner tube portion 12m. The stepped portion 12c is formed at a lower face of the connecting flange 12a of the second discharge tube element 12, and an insulator 14 for forming a discharge gap and vacuum-sealing is fitted into the stepped portion 12c. The thickness of an insulator 14 for forming a discharge gap and vacuum-sealing is larger than the depth of the stepped portion 12c, and the discharge gap 16 with the dimensional difference between the thickness and the depth is formed.

Also, the connecting flange 11b of a bottom end side of the first discharge tube element 11 and the connecting flange 13a of a top end portion of the third discharge tube element 13 support an insulator 15 for forming a discharge gap and vacuum-sealing by sandwiching it between both connecting flanges, and furthermore the first discharge tube element 11 is connected coaxially to the third discharge tube element 13 with respective O-rings 20, 21 in close contact with an insulator 15 and with the discharge gap 17 formed between a bottom end face of an inner tube portion 11m and a top end face of an inner tube portion 13m. The stepped portion 11c is formed at a lower face of the connecting flange 11b of the first discharge tube element 11, and an insulator 15 for forming a discharge gap and vacuum-sealing is fitted into the stepped portion 11c. The thickness of an insulator 15 for forming a discharge gap and vacuum-sealing is larger than the depth of the stepped portion 11c, and the discharge gap 17 with the dimensional difference between the thickness and the depth is formed. As for the connection between connecting flanges 11a, 12a and the connection between connecting flanges 11b, 13a, the flange is usually bolted, not shown, to each other. The bolts also come through insulators 14, 15.

The first discharge tube element 11, the second discharge tube element 12 and the third discharge tube element 13 are conjoined coaxially and compose one discharge tube A assembled from divided three sections.

O-rings 18 to 21 are used for securing a high degree of vacuum-sealed conditions in the discharge tube A assembled from divided three sections composed of first to third discharge tube elements 11, 12, 13. The insulators 14, 15 for forming a discharging gap and vacuum-sealing have also an auxiliary function for securing a degree of a vacuum-sealing.

Of the two output terminals of the high-frequency power supply 25 used as an energy source of the plasma generation, one terminal is connected to the ground (GND) and set as the grounding terminal 25a, and the other terminal is set as the high voltage terminal 25b. The high voltage terminal 25b of the high-frequency power supply 25 is connected to the first discharge tube element 11, positioned at the middle of the vertical direction, of three discharge tube elements, and the grounding terminal 25a of the high-frequency power supply 25 is connected to the second discharge tube element 12 and the third discharge tube element 13 positioned at the upper and the lower thereof, respectively.

Further, though not illustrated in FIG. 1, electromagnetic shielding is generally applied by covering the whole plasma generating apparatus, or at least the whole discharge tube element connected to the high voltage terminal 25b of the high-frequency power supply 25 with a conductor to prevent an electromagnetic wave of a high-frequency from leaking out of the plasma generating apparatus (It is similar in the following embodiments).

Since the first discharge tube element to the third discharge tube elements 11, 12, 13 are respectively fabricated from metal materials, and insulators 14, 15 for forming a discharge gap and vacuum-sealing are interposed between these discharge tube element, respectively, and the first discharge tube element 11 separates discharge gaps 16, 17, the respective discharge tube elements 11, 12, 13 also serve as discharge electrodes. That is, a top end of an inner tube portion 11m of the first discharge tube element 11 of metal material and a bottom end of an inner tube portion 12m of the second discharge tube element 12 of metal material form a pair of discharge electrodes at the discharge gap 16 portion, and a bottom end of an inner tube portion 11m of the first discharge tube element 11 of metal material and a top end of an inner tube portion 13m of the third discharge tube element 13 of metal material form an another pair of discharge electrodes at the discharge gap 17 portion. At discharge gaps 16, 17 in respective discharge electrodes, a high-frequency electromagnetic field is formed by high-frequency power applied from the high-frequency power supply 25.

One discharge tube A assembled from three sections, which is composed of first to third discharge tube elements 11, 12, 13, takes on a sequential cylindrical tube form, and the gas introduction port 12b is provided at one end thereof and the plasma discharge port 13b is provided at another end thereof, and the space between the two ends becomes the plasma generating space 26 where gas for plasma generation and plasma flow. The plasma generating space 26 becomes a cylindrical smooth flow path as a whole except the locations of two upper/lower discharge gaps 16, 17, and the extent to which the discharge gaps 16, 17 obstruct the flow of gas for plasma generation and the generated plasma is sufficiently small since the discharge gaps 16, 17 are sufficiently small viewing from the whole of the plasma generating space 26, and therefore gas and plasma flow smoothly. Examples of gas for plasma generation (discharge gas) include argon, hydrogen, oxygen, chlorine, carbon tetrafluoride ($CF_4$), silane and nitrogen trifluoride ($NF_3$).

With respect to high-frequency voltage (V) applied at the discharge gap 16, letting $V=V_o \sin 2\pi f t$ and taking the gap width as d, the high-frequency electric field generated E obeys $E=E_o \sin \theta 2\pi f t$, wherein $E_o=V_o/d$. By setting the gap width d to an appropriate small value, it is sufficiently possible to make an amplitude $E_o$ of the high-frequency electric field E a required value.

By the way, instead of connecting the high voltage terminal 25b of the high-frequency power supply 25 to the first discharge tube element 11 being at the middle of the vertical direction and connecting the grounding terminal 25a of the high-frequency power supply 25 to the second discharge tube element 12 and the third discharge tube element 13 being at the upper and the lower thereof, respectively, by connecting in reverse relation, a similar function is achieved. But, considering a safety standpoint in an aspect of connecting to gas piping and gas cylinder and attaching to a plasma processing chamber, it is preferable to connect as illustrated. However, the latter may be used when safety can be secured through other countermeasures.

In gas for plasma generation which flows smoothly on a face of the inner circumference of an inner tube portion 12m of the second discharge tube element 12 of metal material, plasma ignition is performed at the discharge gaps 16 to which the high-frequency electromagnetic field is applied, and high-frequency discharge is spread across the whole of the plasma generating space 26 by a chain reaction once plasma ignition is realized, and therefore good plasma generation can be performed.

With respect to metal material composing the first to third discharge tube elements 11, 12, 13, aluminum which is resistant to cause contamination of impurity on substances to be processed, such as semiconductor devices, is preferably used when this plasma generating apparatus is used in a plasma process in a semiconductor fabricating. That is, in use of heavy metal such as stainless steel or copper, it cannot be said it is preferable as there is a possibility that these materials cause the contamination of impurity.

With respect to an insulator composing insulators 14, 15 for forming a discharging gap and vacuum-sealing, an inorganic insulator of high purity such as high purity alumina, sapphire, quartz and aluminum nitride is preferable. Or, polyimide, tetrafluoroethylene (TEFLON (trademark of Du Pont Corp.)), polyethylene may also be used.

However, with respect to metal material and an insulator, it is not required to be limited to the above substances, and any substance other than the above examples may be adopted as far as they display desired functions.

Next, an operation of the plasma generating apparatus of the first preferred embodiment constructed as described above will be described. Here, the plasma generating apparatus is to be attached to a plasma processing chamber, not shown, at the flange 13c for mounting to a device of the third discharge tube element 13.

Interior space of a plasma processing chamber and the plasma generating space 26 which is an interior space of one discharge tube A assembled from three sections, which is composed of the first through third discharge tube elements 11, 12, 13, is evacuated by evacuating the plasma processing chamber of air. Then, gas for plasma generation is supplied from the gas introduction port 12b toward the plasma generating space 26 and pressurized to specified pressure, and high-frequency power is supplied to an upper and the lower discharge gaps 16, 17, respectively, by actuating the high-frequency power supply 25, and a high-frequency electromagnetic field is generated at the discharge gaps 16, 17 communicating with the plasma generating space 26. Simultaneously, cooling medium is supplied from the cooling medium flow inlet tube 22a, 23a, 24a located on the lower side in the first through third discharge tube elements 11, 12, 13, respectively, moved upward in the cooling medium flow paths 22b, 23b, 24b and discharged from the cooling medium flow outlet tube 22c, 23c, 24c. In expensive tap water may be used as cooling medium, or ethylene glycol, fluorocarbon or deionized water may also be used other than this.

Gas for plasma generation introduced from the gas introduction port 12b into the plasma generating space 26 flows through the plasma generating space 26 towards the plasma discharge port 13b. Part of the gas flows smoothly on a face of the inner circumference of an inner tube portion 12m of the second discharge tube element 12 of metal material. At an upstream discharge gaps 16 to which a high-frequency power is applied, large voltage and a large electric field are generated since the gap is sufficiently narrow. Plasma ignition (firing) is performed on flowing gas for plasma generation at the discharge gap 16 to which such a high-frequency electromagnetic field is formed. Once plasma ignition is realized, a chain reaction is promoted by gradually increasing high-frequency power which the high-frequency power supply 25 outputs, and high-frequency discharge is spread across the whole of the gas flowing in the plasma generating space 26 by the chain reaction, and therefore good plasma generation can be performed. However, this does not necessarily require a gradually increase in the high-frequency power. Further, plasma ignition is also performed at the downstream discharge gap 17. Preferably, the gap between discharge gaps 16, 17 is narrow as far as possible.

The gas which is ionized to plasma in the plasma generating space 26 in this manner, i.e., plasma flows from the plasma discharge port 13b of the third discharge tube element 13 into a plasma processing chamber, not shown, and performs plasma processing such as etching and ashing for semiconductor wafer and liquid crystal substrate in a plasma processing chamber.

The plasma which is generated in the plasma generating space 26 becomes a high temperature. Inner tube portions 11m, 12m, 13m, exposed to the plasma of a high temperature, of the first through third discharge tube elements 11, 12, 13 are cooled by heat exchange with cooling medium flowing through cooling medium flow paths 22b, 23b, 24b outside the inner tube portions. Since the inner tube portions 11m, 12m, 13m of the first through third discharge tube elements 11, 12, 13 are composed of metal material, its thermal conductivity is higher than that of an insulating discharge tube in the case of prior art. Accordingly, since retarding effects upon temperature rises of the inner tube portions 11m, 12m, 13m become large, these portions are controlled well within ranges of specified temperature.

In addition, since the inner tube portions 11m, 12m, 13m are composed of metal material, their thermal strength and physical strength are higher than that of an insulating discharge tube in the case of prior art. Accordingly, as a whole, thermal effects to which the inner tube portions 11m, 12m, 13m are subjected to become sufficiently small compared with an insulating discharge tube in the case of prior art. The thermal deformation thereof is less and thermal deterioration is also less. Though the plasma generating space 26, which is an interior space of the discharge tube A assembled from three sections, has a large pressure difference between the space and the outside of atmospheric pressure since the interior of the space 26 is evacuated, the discharge tube A does not fail from the pressure difference as distinct from an insulating discharge tube because the discharge tube A is made of metal material and has sufficiently large physical strength.

Gas for plasma generation introduced into the plasma generating space 26 varies with use and condition, and though highly reactive plasma is generated depending on a gas property in some cases, the discharge tube A assembled from divided three sections of metal material experiences less corrosion than an insulating discharge tube in the case of prior art.

Since the discharge tube A assembled from three sections experiences less deterioration even over a long-duration use, a maintenance cycle on the first through the third discharge tube elements 11, 12, 13 may be relatively lengthened compared with prior art, and the life of the first through the third discharge tube elements 11, 12, 13 is extended, and an interval of the discharge tube elements replacement is also relatively lengthened, and therefore the maintenance cost may be significantly reduced.

The first through the third discharge tube elements 11, 12, 13 are preferably made of aluminum, and aluminum is low in the material cost and also the initial cost compared with an insulating discharge tube in the case of prior art. Since the discharge tube of the invention is a capacitive coupling type, the structure is simpler compared with that of prior art which is an inductive coupling type, using induction coils, and, in this sense, the initial cost may be reduced.

Though the discharge tube A assembled from three sections is a combined body of the first through the third discharge tube elements 11, 12, 13, the performance of the vacuum-sealing is sufficient because connecting flanges 11a, 12a, 11b, 13a having relatively large area and insulators 14, 15, having relatively large area, for forming a discharging gap and vacuum-sealing are used and further O-rings 18 to 21 are used.

Figure 3:
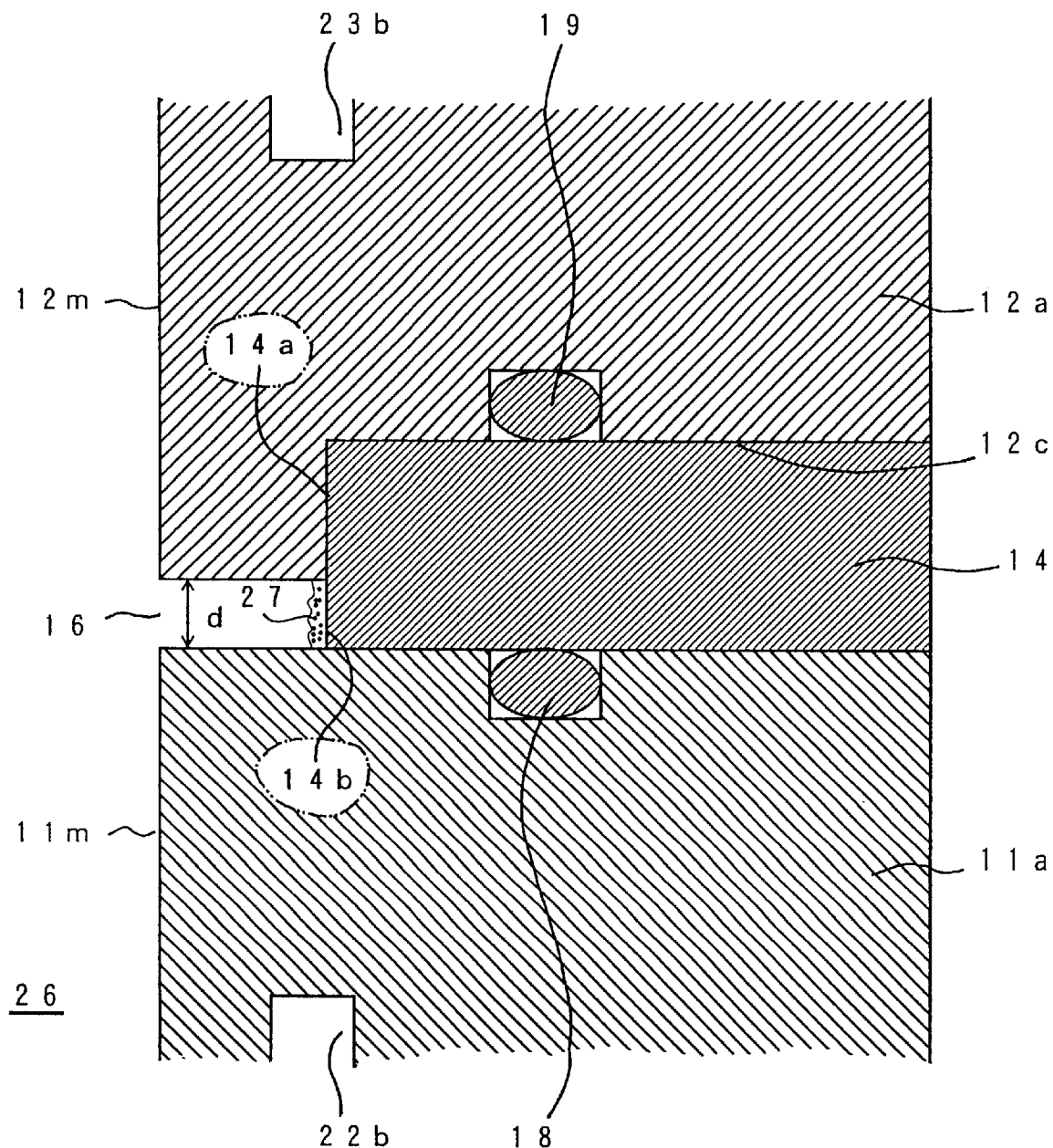
FIG. 3 is an enlarged sectional view illustrating under magnification the vicinity of a discharge gap to point out the new conceivable problems in a plasma generating apparatus of the first preferred embodiment.

A second preferred embodiment of the present invention is associated with an improvement of the first preferred embodiment. FIG. 3 is a view illustrating under magnification the vicinity of the discharge gap 16 of the first preferred embodiment. An insulator 14 for forming a discharge gap and vacuum-sealing is fitted into the stepped portion 12c formed at the connecting flange 12a of a bottom end portion of the second discharge tube element 12. The connecting flange 11a of a top end portion of the first discharge tube element 11 is connected to the connecting flange 12a of the second discharge tube element 12 of metal material in a state of supporting the insulator 14 for forming a discharge gap and vacuum-sealing by sandwiching it. A discharge gap 16 is formed between a top end face of an inner tube portion 11m of a first discharge tube element 11 and a bottom end face of an inner tube portion 12m of a second discharge tube element 12. A gap dimension d of the discharge gap 16 becomes considerably short. Part of a face 14a of the inner circumference of an insulator 14 for forming a discharging gap and vacuum-sealing contacts with a peripheral face of a step portion 12c, and part is exposed to the discharge gap 16. The exposed portion is defined as an exposed face 14b of the inner circumference of an insulator.

In some cases, a conductive substance is contained in plasma generated in a plasma generating space 26. In such the case, there is possibility that the conductive substance is deposited on and adheres to an exposed face 14b of the inner circumference of an insulator 14 for forming a discharging gap and vacuum-sealing during a long-duration use. The conductive substance which adheres and is deposited like this is defined as adhesion deposition conductive substance 27.

When a substance adhering and deposited is an insulating substance, it does not become a problem so much, but when a substance adhering and deposited is a conductive substance, there is a possibility the following problem will occur. A plasma generating apparatus in accordance with the present invention is a capacitive coupling type, and the first and second discharge tube elements 11, 12, which oppose the inner tube portions 11m, 12m, are made of metal material. There is possibility that a short circuit occurs between the inner tube portions 11m, 12m of metal material, which form the discharge gap 16, through the adhesion deposition conductive substance 27 at an exposed face 14b of the inner circumference of the insulator 14 for forming a discharging gap and vacuum-sealing. When such a short circuit occurs during a long-duration use, the discharge gap 16, producing high-frequency discharge, does not work. That is, though the opposed inner tube portions 11m, 12m of metal material have spatially a gap between them, this gap is electrically a short circuit, and therefore high-frequency discharge does not occur. Accordingly, plasma generation is prevented. And furthermore, since electric resistance between inner tube portions 11m, 12m is lowered by a large amount due to the adhesion deposition conductive substance 27, and electrical breakdown is caused, a large current, applied from a high-frequency power supply 25, flows through the adhesion deposition conductive substance 27, and it becomes a critical problem from a safety standpoint.

Though a short circuit due to the adhesion deposition conductive substance 27 at the discharge gap 16 positioned on upstream side has been described above, there is a similar problem also in the discharge gap 17, positioned on downstream side, between the first discharge tube element 11 and the third discharge tube element 13.

To avoid this problem, it is required to check and see the conditions of adhesion and deposition of conductive substance by periodically or irregularly inspecting. Then, maintenance cost is increased.

Incidentally, as the conductive substance contained in plasma, substances peeled from a face of the inner circumference of gas cylinder in which gas for plasma generation supplied from a gas introduction port 12b is held and a face of the inner circumference of piping and substances peeled or sputtered from a face of the inner circumference of the discharge tube elements 11, 12, 13 of metal material are conceivable.

A plasma generating apparatus of the second preferred embodiment is one to reduce disadvantages as far as possible.

Figure 4:
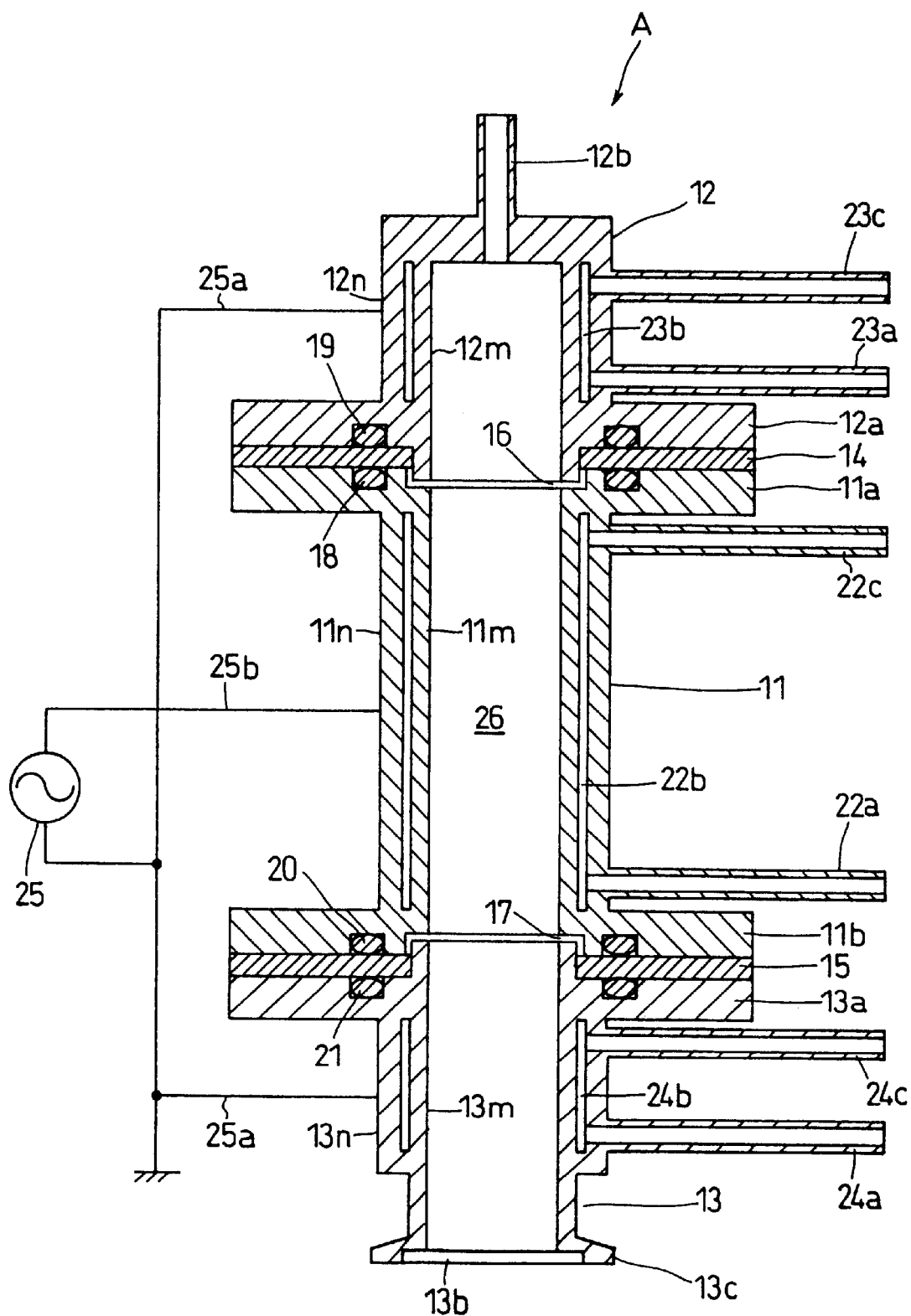
FIG. 4 is a vertical sectional view illustrating schematically a structure of a plasma generating apparatus of a high-frequency discharge type of the second preferred embodiment of the present invention.
Figure 5:
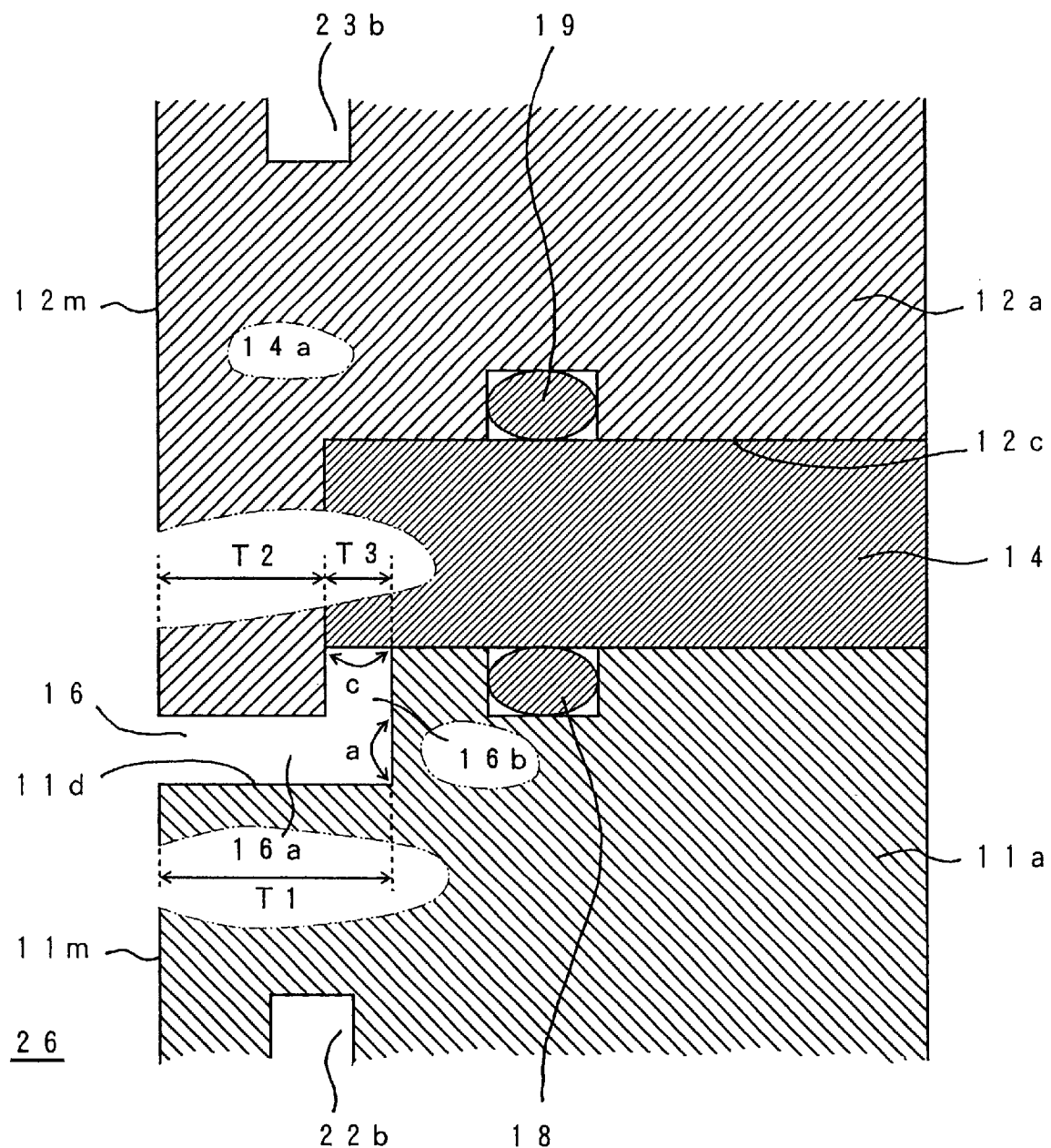
FIG. 5 is an enlarged sectional view illustrating under magnification the vicinity of a discharge gap which is the essential part of a plasma generating apparatus of the second preferred embodiment.

FIG. 4 is a vertical sectional view illustrating schematically a structure of a plasma generating apparatus of a high-frequency discharge type of the second preferred embodiment and FIG. 5 is an enlarged sectional view illustrating under magnification the vicinity of a discharge gap being its essential part.

In FIG. 4 and FIG. 5, the same numerals as that in FIG. 1 and FIG. 2 of the first preferred embodiment indicate like components and so the detailed description is omitted. Further, matter which is described in a first preferred embodiment and which is not described repeatedly in a second preferred embodiment is treated as matter which corresponds to the second preferred embodiment as is and the detailed description is omitted. The points of difference between the second preferred embodiment and the first preferred embodiment are as follows.

While, in the case of the first preferred embodiment, the depth of a stepped portion 12c formed at a connecting flange 12a of the second discharge tube element 12 is smaller than the thickness of the insulator 14, the depth of a stepped portion 12c is larger than the thickness of the insulator 14 in the case of a second preferred embodiment.

And, while, in a first preferred embodiment, a top end face of the connecting flange 11a of the first discharge tube element 11, on which the insulator 14 is made to abut, is flat over all, and an inner circumference portion of the flat top end face is one discharge plane of a discharge gap 16, in the second preferred embodiment, a step portion 11d is formed on the side of inner circumference of a connecting flange 11a, and a discharge gap 16 is formed by opposing a horizontal part of a step portion 11d and a bottom end face of an inner tube portion 12m of the second discharge tube element 12. Numeral 16a indicates a gap of horizontal part connecting to a discharge gap 16, and numeral 16b indicates a gap of vertical part connecting to the rear side of a gap of horizontal part 16a and becomes a gap for limiting deposition. A dimension T1 in circumferential direction of a horizontal part of a step portion 11d is made to be larger than thickness T2 of the inner tube portion 12m, and the gap 16b for limiting deposition with dimension T3 which is a difference between T1 and T2 is formed to be connected to the gap of horizontal part 16a. The gap of horizontal part 16a is a part along the direction perpendicular to the direction of a tube axis of a discharge tube element and the gap for retarding deposit 16b is a part along the direction of a tube axis of a discharge tube element.

Range a of a vertical part of a step portion 11d is a region which corresponds directly in the horizontal direction for an inlet of the discharge gap 16. A conductive substance contained in plasma mainly adheres to and is deposited on the range a.

A short circuit between the inner tube portion 11m and the inner tube portion 12m becomes a problem in a range c at an insulator 14 for forming a discharging gap and vacuum-sealing. Since the range c is positioned at a rear end of the gap for retarding deposit 16b, and the gap for retarding deposit 16b is inflected by 90 degree of angle relative to a discharge gap 16, a conductive substance hardly adheres to and is deposited on a gap for retarding deposit 16b at a rear end. Accordingly, a short circuit between the inner tube portion 11m and the inner tube portion 12m may be effectively retarded.

Though electrical breakdown at a discharge gap 16 between the first discharge tube element 11 and the second discharge tube element 12 has been described above, electrical breakdown at the discharge gap 17 between the first discharge tube element 11 and the third discharge tube element 13 is similar.

That is, even when a plasma generating apparatus is used for a long time in a situation that a conductive substance is to be contained in plasma, electrical breakdown between the inner tube portion 11m and the inner tube portion 12m, which sandwich a discharge gap 16, does not occur, and it is possible to perform plasma ignition and to generate plasma as well as desired, and this leads to enhancing the reliability of a plasma generating apparatus. And, the maintenance load may be reduced and the maintenance cost may be reduced.

As a preferred embodiment of a variation of the second preferred embodiment, embodiments of a structure like FIG. 6A to FIG. 6F are conceivable.

Figure 6A:
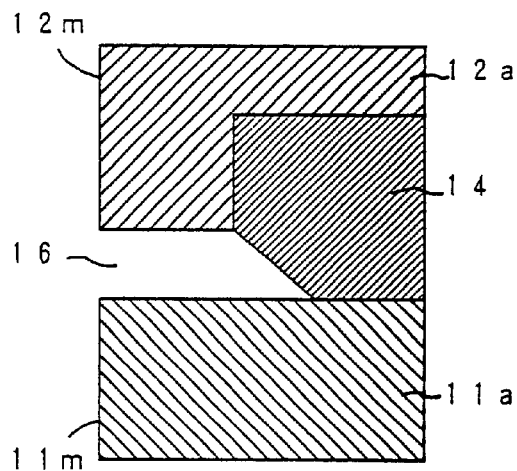
FIGS. 6A to 6F are enlarged sectional views illustrating under magnification the vicinity of a discharge gap which is the essential part of a variation of the second preferred embodiment.

FIG. 6A is a configuration to prevent electrical breakdown by forming a part, facing the discharge gap 16, of an insulator 14 for forming a discharging gap and vacuum-sealing in tapered shape to enlarge area.

Figure 6B:
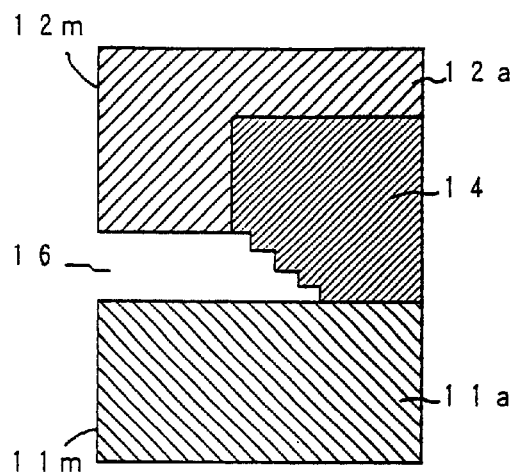

FIG. 6B is a configuration to retard further adhesion and deposition of a conductive substance by further forming slash being indented in cross section at an inclined portion of an insulator 14 for forming a discharging gap and vacuum-sealing to enlarge area.

Figure 6C:
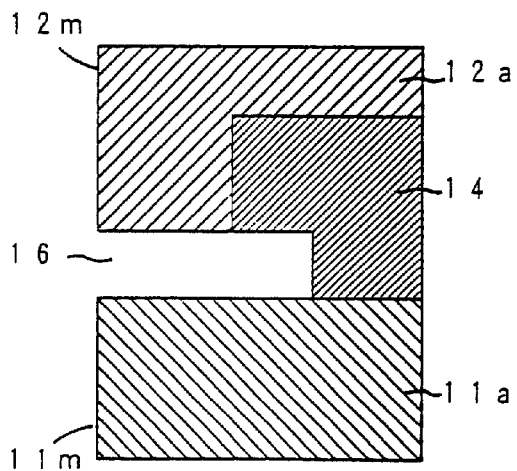

FIG. 6C is a configuration to prevent electrical breakdown by removing part of an insulator 14 for forming a discharging gap and vacuum-sealing to enlarge area.

Figure 6D:
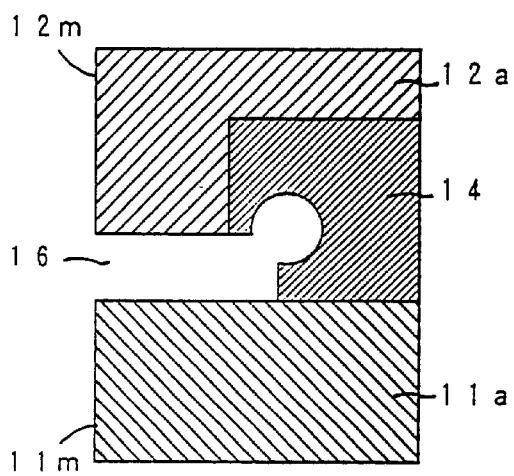
Figure 6E:
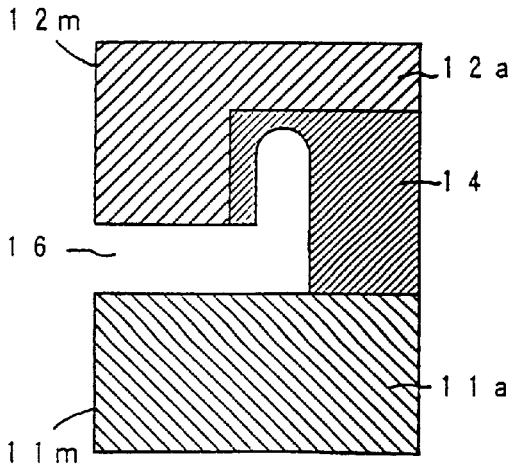
Figure 6F:
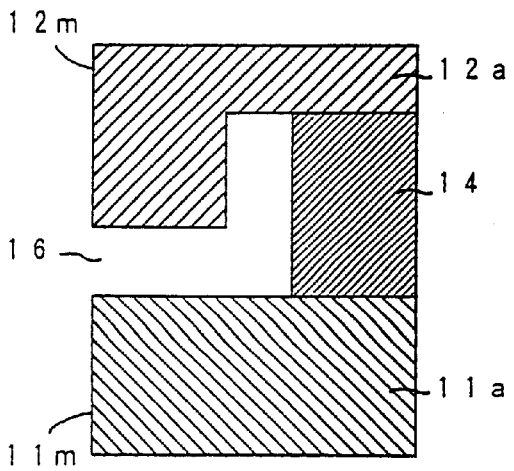

FIG. 6D to FIG. 6F are configurations to prevent electrical breakdown more effectively by removing more than that of FIG. 6C of an insulator 14 for forming a discharging gap and vacuum-sealing to enlarge area. The difference between FIG. 6F and FIG. 5 is that a connecting flange 11a does not have a step portion 11d and is flat over all.

What is described in FIG. 6A to FIG. 6F corresponds to a downstream discharge gap 17. However, structure is inverted from top to bottom due to the structural difference.

A third preferred embodiment is associated with an improvement of a first preferred embodiment. In the first to the third discharge tube elements 11, 12, 13 in a discharge tube A temperature rises of the respective inner tube portions 11m, 12m, 13m are controlled by flowing cooling medium through cooling medium flow paths 22b, 23b, 24b of water jacket type. However, the insulators 14, 15 for forming a discharge gap and vacuum-sealing are subject to local overheating since they are exposed directly to the plasma of a high temperature and a cooling medium flow path does not come near the insulators. Therefore, the discharge tube elements are apt to cause the thermal deformation, and there is a possibility that the thermal deformation produces failures such as cracks and fractures in the insulators 14,15 and cause the vacuum seal to break.

Figure 7:
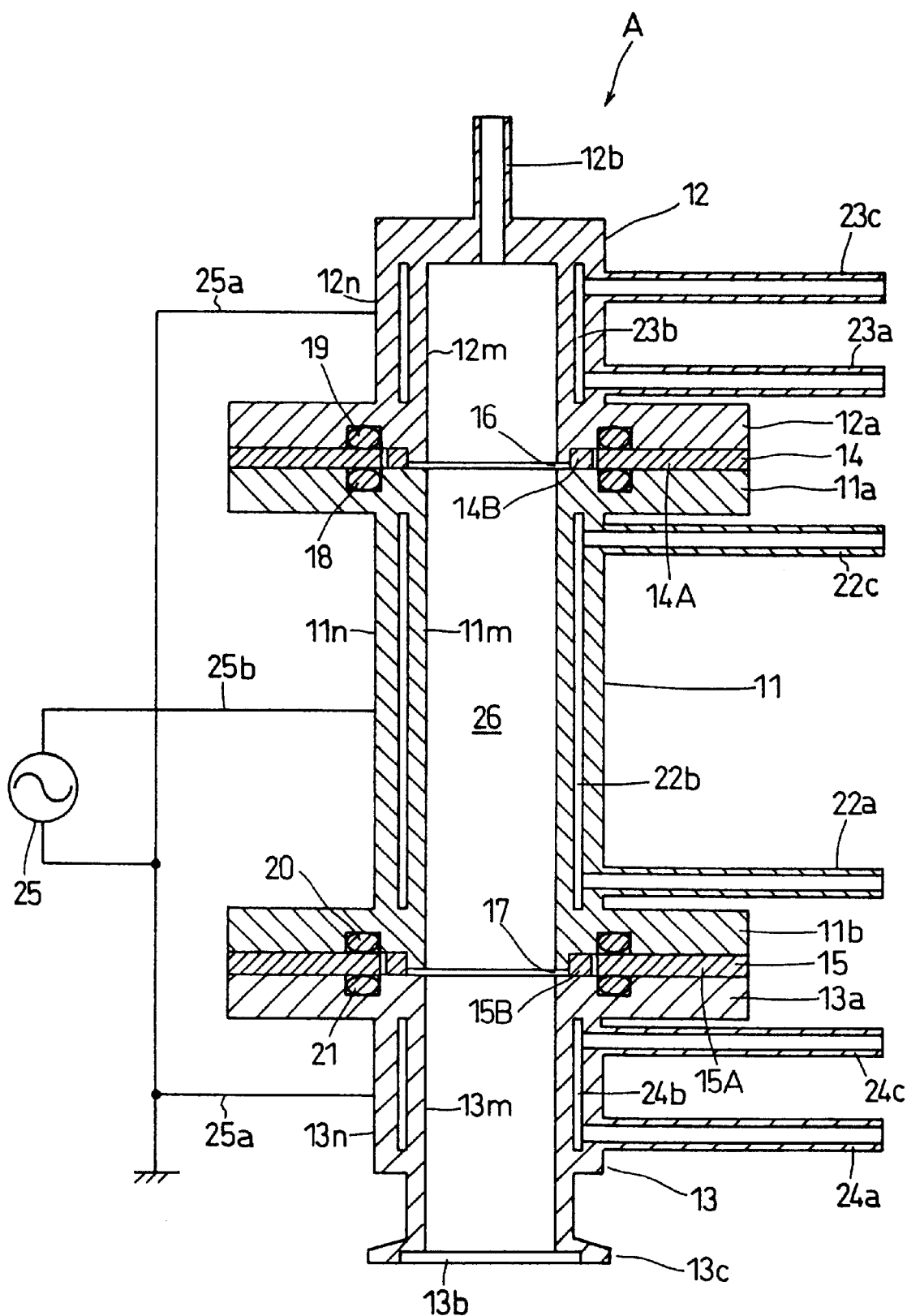
FIG. 7 is a vertical sectional view illustrating schematically a structure of a plasma generating apparatus of a high-frequency discharge type of the third preferred embodiment of the present invention.

A plasma generating apparatus of a third preferred embodiment is devised in such a way that the disadvantage described above is avoided. FIG. 7 is a vertical sectional view illustrating schematically a structure of a plasma generating apparatus of a high-frequency discharge type of the third preferred embodiment of the present invention, and FIG. 8 is an enlarged sectional view illustrating under magnification the vicinity of a discharge gap which is the essential part of the plasma generating apparatus.

Figure 8:
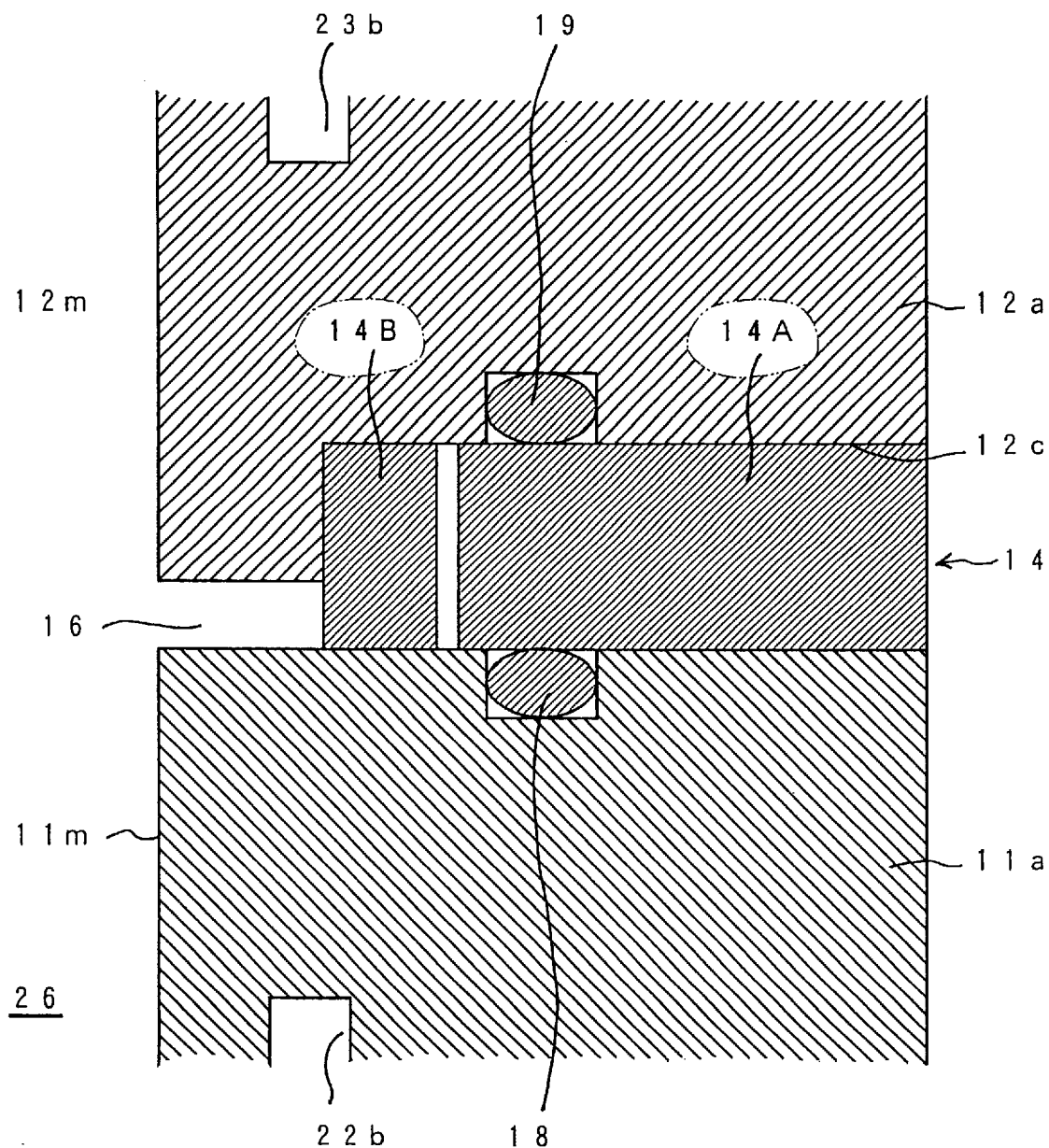
FIG. 8 is an enlarged sectional view illustrating under magnification the vicinity of a discharge gap which is the essential part of a plasma generating apparatus of the third preferred embodiment.

In FIG. 7 and FIG. 8, the same numerals as that in FIG. 1 and FIG. 2 of the first preferred embodiment indicates like components and so a detailed description is omitted. Further, matter which is described in the first preferred embodiment and which is not described again in the third preferred embodiment is treated as matter which also corresponds to the third preferred embodiment as is and the detailed description is omitted. The points of difference between the third preferred embodiment and the first preferred embodiment are as follows.

Insulators 14, 15, respectively, for forming a discharging gap and vacuum-sealing are divided and separated into an outer body portion 14A, 15A for maintaining a vacuum and an inner protecting portion 14B, 15B exposed to plasma. In a condition illustrated in the drawing, though these body portions 14A, 15A and protecting portions 14B, 15B may be spatially separated a little, it is not necessarily required to do so, and both may mutually contact. Though, keeping them separated a little allows to reduce the heat transferred from protecting portions 14B, 15B to body portions 14A, 15A and therefore to retard the thermal deterioration of the body portions 14A, 15A.

Even though there is possibility of developing crack and fracture since protecting portions 14B, 15B are exposed directly to plasma, failure such as crack and fracture does not communicate with the body portions 14A, 15A separated from the protecting portions 14B, 15B, and therefore the body portions 14A, 15A are free from thermal deterioration. As a result of this, the performance of vacuum-sealing through insulators 14, 15 for forming a discharging gap and vacuum-sealing is secured over an extended time period and the reliability of the appropriate plasma generating apparatus as a plasma source may be enhanced.

Further, by extending both or either of the cooling medium flow paths 22b, 23b of water jacket type to both or either of the connecting flanges 11a, 12a, or by extending both or either of the cooling medium flow paths 22b, 24b of water jacket type to both or either of connecting flanges 11b, 13a, thermal deterioration of the insulators 14, 15 may be retarded. In this case, both of insulators the 14, 15 may be not divided into a body portion and a protecting portion, or may be divided.

Further, it is also possible to combine the first preferred embodiment and the third preferred embodiment described above, and thus the reliability may be further enhanced.

A fourth preferred embodiment is one associated with a variation of cooling system for a first discharge tube element. A fourth preferred embodiment is described referring to FIG. 9 and FIG. 10.

Figure 9:
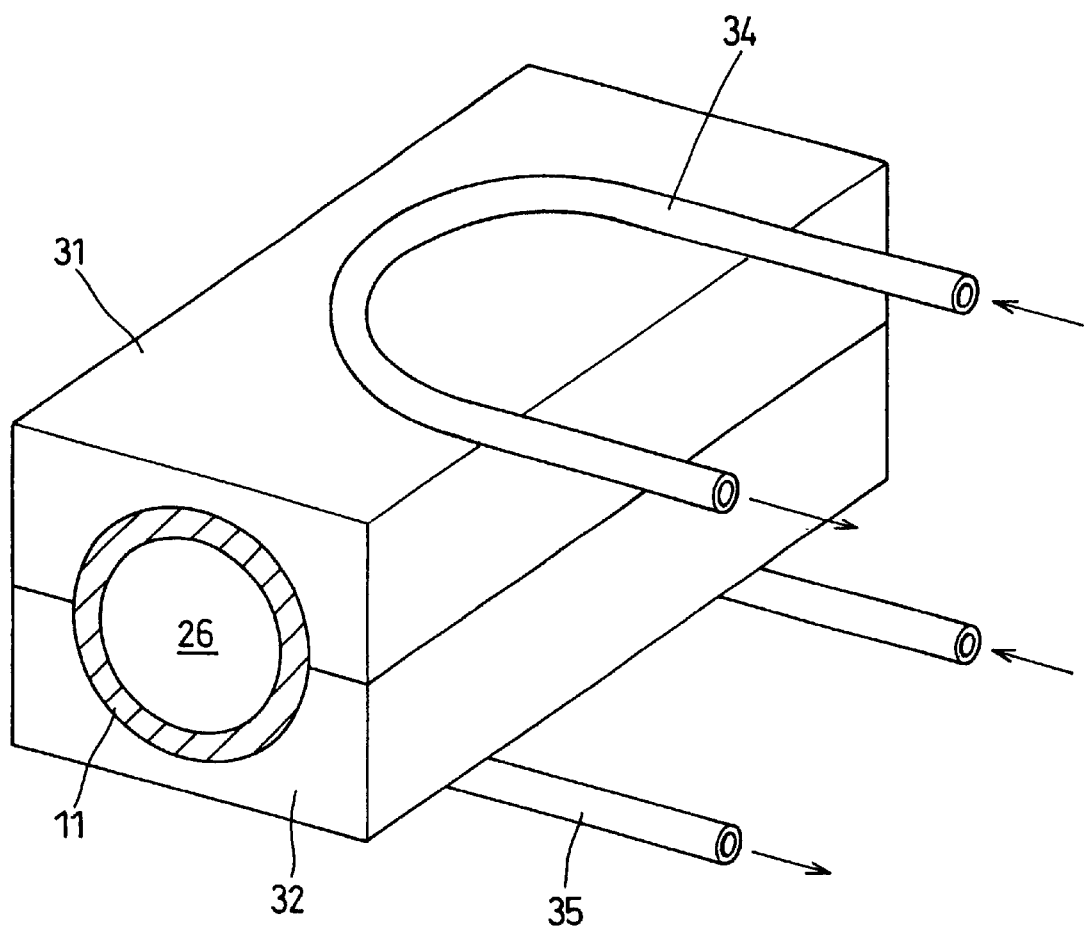
FIG. 9 is a schematic perspective view illustrating a structure for cooling of a first discharge tube element in a plasma generating apparatus of the fourth preferred embodiment of the present invention.
Figure 10:
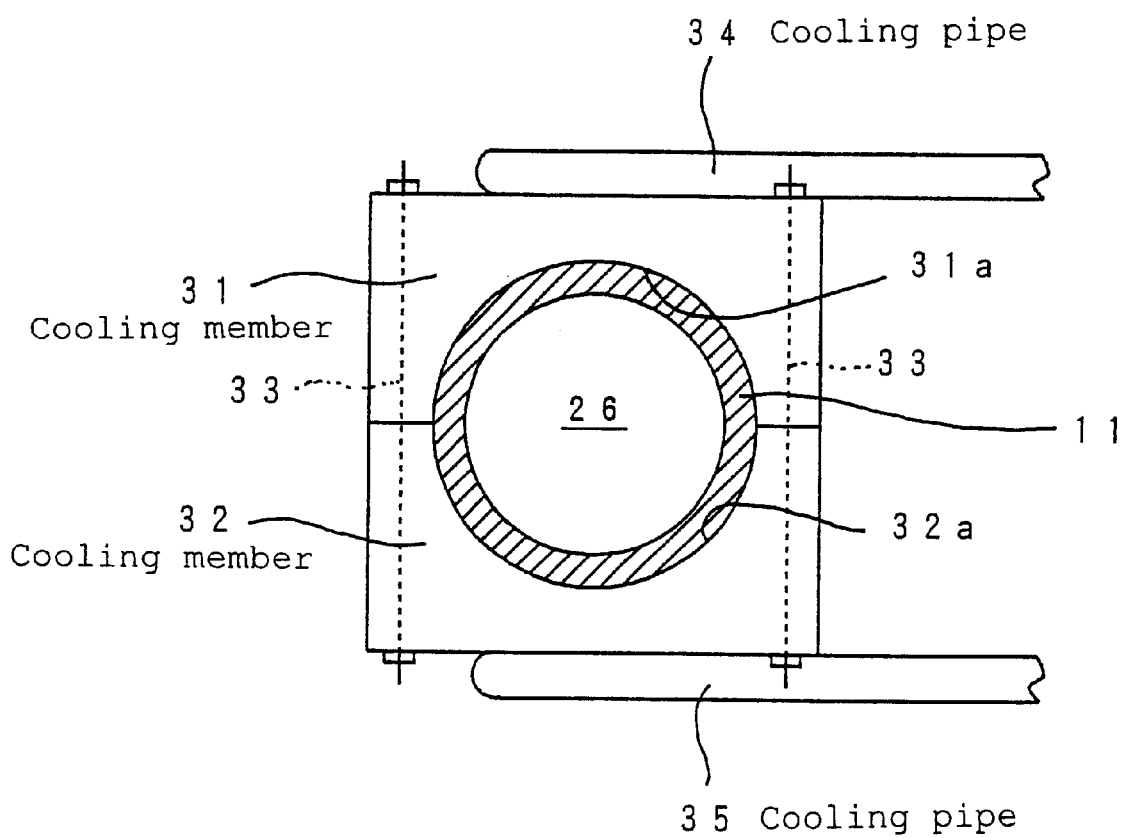
FIG. 10 is a front view of a structure for cooling of the fourth preferred embodiment.

FIG. 9 is a schematic perspective view illustrating a structure for cooling for the first discharge tube element 11 (the relation of connection with a flange and a high-frequency power supply is not illustrated) and FIG. 10 is a front view thereof.

Though, in the previous first to third preferred embodiments, the first discharge tube element 11 takes on a double tube structure forming the cooling medium flow path 22b between the inner tube portion 11m and the outer tube portion 11n, in the fourth preferred embodiment, a first discharge tube element 11 is made as a single tube structure which is solid in portion of its thickness. An outer periphery face of the first discharge tube element 11 is enveloped with a pair of cooling members 31, 32 of a butt-joined type, and the cooling members 31, 32 are combined fixed with bolts 33 through both members. Cooling members 31, 32 have hemicylindrical inner circumferential faces 31a, 32a and respective inner circumferential face 31a, 32a are brought into intimate contact with an outer periphery face of the discharge tube element 11. Cooling pipes 34, 35 are secured to outer side faces of cooling members 31, 32 by welding or brazing. As component material of cooling members 31, 32 and cooling pipes 34, 35, material having high thermal conductivity such copper is suitable.

When plasma discharge is carried out, cooling medium flows through cooling pipes 34, 35 and heat is exchanged between cooling members 31, 32 and cooling medium. The discharge tube element 11 is raised in temperature due to heat liberation in a plasma generating space 26. Heat is absorbed by cooling members 31, 32. Heat absorbed by the cooling members 31, 32 is removed through heat exchange by cooling medium of the cooling pipes 34, 35. Thus, temperature rise of the discharge tube element 11 is limited and the temperature thereof is controlled within a prescribed range.

Since, in a cooling system of a fourth preferred embodiment, a rough countermeasure may be used for leakage of liquid compared with cooling systems of double tube structure in the first to the third preferred embodiments, a structure of a discharge tube may be simplified. The initial cost is also reduced.

Further, either of cooling pipes 34 or 35 may be provided with cooling members 31, 32 in place of providing cooling members 31, 32, respectively, with cooling pipes 34, 35.

Also, cooling members may take on a constitution of three sections divided or more sections divided in place of dividing cooling members enveloping the discharge tube element 11 into two sections.

And, eliminating cooling members, a cooling pipe may be conjoined to fix directly to an outer periphery face of the discharge tube element 11 by welding or brazing. In this case, it is preferred that the cooling pipe is wound in a helical fashion around an outer periphery face of the discharge tube element to secure as wide area of heat exchange as possible.

The cooling system described above is not limited to the first discharge tube element 11, and is applicable to the second and third discharge tube elements 13.

Further, a fourth preferred embodiment may be applicable to any type of plasma generating apparatus of the first to a third preferred embodiment described above.

A fifth preferred embodiment is one associated with a plasma generating apparatus connected to the downstream of a plasma processing chamber. Though the plasma generating apparatus in the above first to fourth preferred embodiments is constructed as an apparatus of a type in which is mainly connected to the upstream of a plasma processing chamber, the present invention is not limited to this type and is applicable to type of being connected to the downstream.

Figure 11:
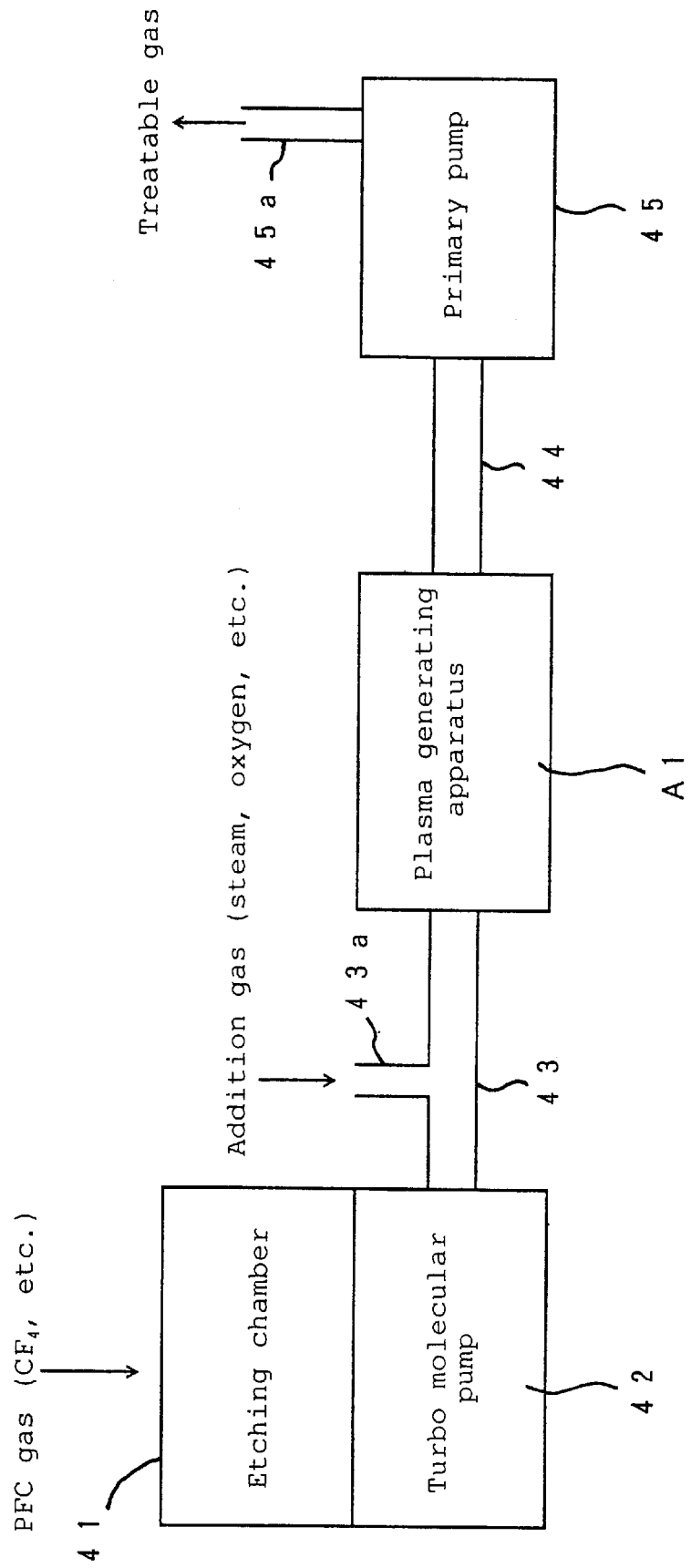
FIG. 11 is a schematic illustration of an example of an arrangement of a plasma generating apparatus of the fifth preferred embodiment of the present invention.

FIG. 11 illustrates schematically an example of an arrangement of a plasma generating apparatus of the fifth preferred embodiment. In FIG. 11, numeral 41 is an etching chamber acting as a plasma processing chamber, 42 is a high vacuum turbo molecular pump, connected to the downstream of a chamber 41, for inducing gas in the chamber 41 to the side of a plasma generating apparatus A1, 43 a pipe connecting between a turbo molecular pump 42 and a plasma generating apparatus A1 for communicating, 43a an induction port, connected to the pipe 43 for joining, of addition gas, 45 a low vacuum primary pump for inducing gas produced in a plasma generating apparatus A1, 44 a pipe connecting between a plasma generating apparatus A1 and a primary pump 45 for communicating and 45a an exhaust port.

Gas produced in an etching chamber 41 is harmful. The harmful gas is induced by a high vacuum of a turbo molecular pump 42 and introduced to a plasma generating apparatus A1 through a pipe 43. On the way, addition gas such as steam and oxygen is added from an induction port 43a. In a plasma generating apparatus A1, harmful gas is reacted with addition gas under plasma existence and converted to a substance easy to treat. When the harmful gas is, for example, $CF_4$ and it reacts with steam ($H_2O$), it becomes $CO_2$ and HF. A primary pump 45 induces gas easy to treat produced in a plasma generating apparatus A1 and introduces the gas through an exhaust port 45a to a downstream treatment facilities. The gas is treated finally at the treatment facilities. For example, in the above example, HF is dissolved in water and rendered harmless by being reacted with an alkaline substance. Or, exhaust gas is removed by an adsorbent or burnt.

Figure 12:
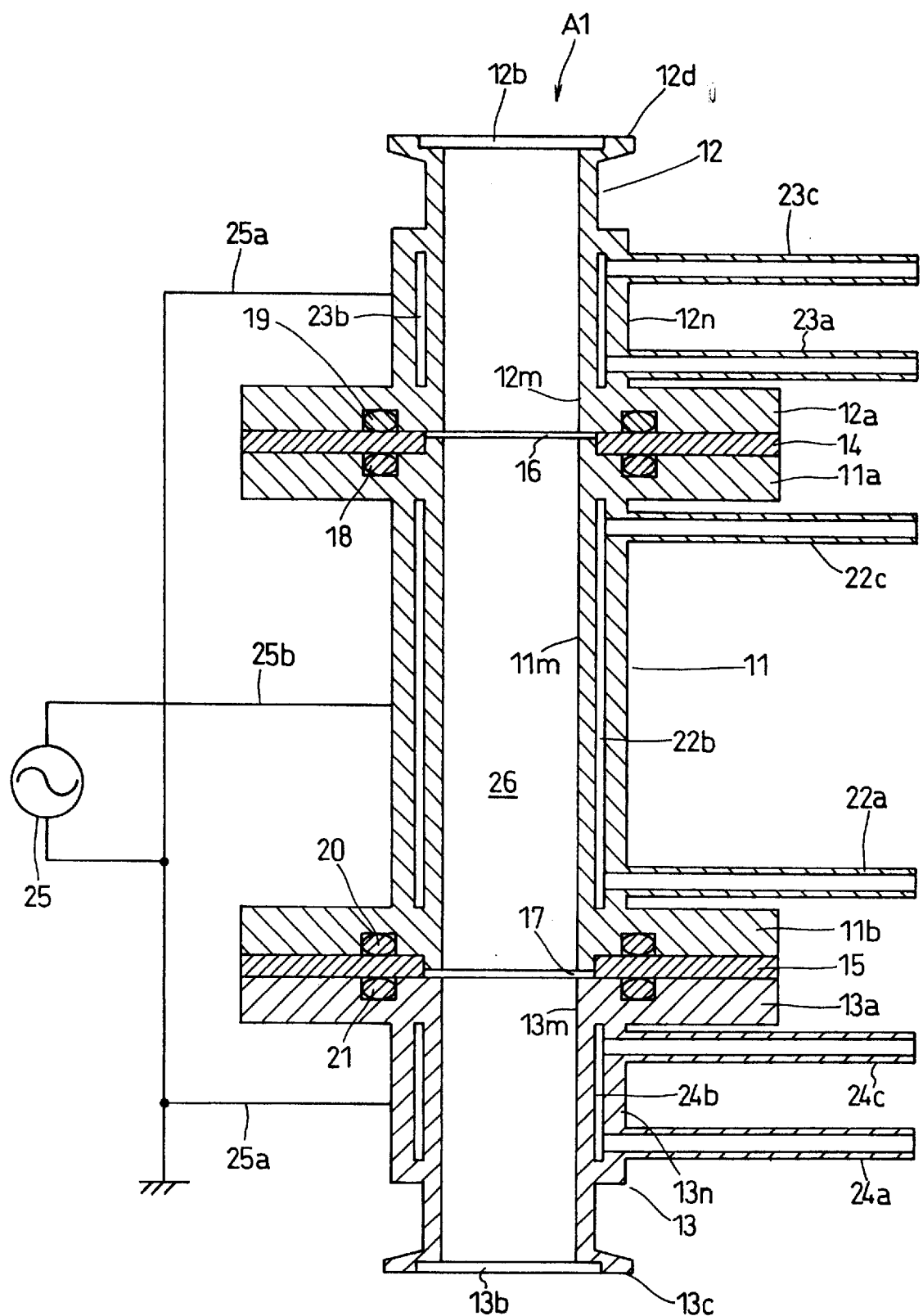
FIG. 12 is a vertical sectional view illustrating a structure of the fifth preferred embodiment of the present invention.

FIG. 12 is a vertical sectional view illustrating a structure of a suitable plasma generating apparatus A1 in a fifth preferred embodiment. In the plasma generating apparatus A1 of the fifth preferred embodiment, the points of difference between a constitution in FIG. 12 and that in FIG. 1 are as follows. A second discharge tube element 12 has a flange 12d for connection as well as a flange 13c for mounting to a device of the third discharge tube element 13. A flange 12d of the second discharge tube element 12 is installed for connecting to the pipe 43 for connecting to the turbo molecular pump 42 positioned upstream thereof, and a flange 13c for mounting to a device of the third discharge tube element 13 is installed for connecting to a pipe 44 for connecting to a primary pump 45 positioned downstream thereof.

In the plasma generating apparatus A1 the second discharge tube element 12 has the same structure as the third discharge tube element 13. They are in symmetric relation in the drawing.

Specifically describing, in the case of FIG. 1, FIG. 4 and FIG. 7, the inner tube portion 12m of the second discharge tube element 12, which forms an upper discharge gap 16, projects downward below a flange 12a, and the inner tube portion 13m of the third discharge tube element 13, which forms a lower discharge gap 17 is flush with a flange 13a, in the case of FIG. 12, the inner tube portion 12m of the second discharge tube element 12, which forms an upper discharge gap 16 is flush with the flange 12a as well as the inner tube portion 13m of the third discharge tube element 13, which forms a lower discharge gap 17 is flush with a flange 13a, in the case of FIG. 12, the inner tube portion 12m of the second discharge tube element 12, which forms an upper discharge gap 16 is flush with the flange 12a as well as the inner tube portion 13m of the third discharge tube element 13, which forms a lower discharge gap 17, is flush with the flange 13a.

The reason for doing so is that the manufacturing cost is reduced by using one discharge tube element for any of the second discharge tube element 12 and the third discharge tube element 13. Also, the reason for doing so is that the limit that the second discharge tube element 12 should be connected to an upstream piping 43 and the third discharge tube element 13 should be connected to a downstream piping 44 is eliminated and flexibility that any discharge tube element might be connected to either piping is provided.

In the case of FIG. 1, FIG. 4 and FIG. 7, the second discharge tube element 12 and the third discharge tube element 13 are in asymmetric relation, and the reason for this is that it is necessary to prevent an improper attachment because positional relations of how the second discharge tube element 12 and the third discharge tube element 13, of which functions differ from each other, are attached to the first discharge tube element 11a re respectively fixed and the discharge tube elements 12, 13 have not compatibility with each other.

However, in the fifth preferred embodiment, the second discharge tube element 12 and the third discharge tube element 13 may be in asymmetric relation. And, in the case of FIG. 1, FIG. 4 and FIG. 7, configurations of the vicinity of discharge gaps 16, 17 may be symmetric.

Further, as a variation of a fifth preferred embodiment, the discharge gap described in the second preferred embodiment, the insulator described in a third preferred embodiment and the feature described in a fourth preferred embodiment may also be applied.

A sixth preferred embodiment particularly performs a plasma generation efficiently even in a condition of a high gas pressure.

The plasma generating apparatus of the first, the second, the third and the fifth preferred embodiments are effective in a condition in which the gas pressure of the interior of a plasma generating space 26 is relatively low. However, since a mean free path of an electron becomes short as the gas pressure of the interior of a plasma generating space 26 increases, it becomes difficult gradually to spread plasma generation across the whole of the plasma generating space The distance traveled by a particle from one collision to next collision is referred to as a free path, and the average value thereof is referred to as a mean free path. A mean free path is inversely proportional to the gas pressure at a constant temperature. That is, the higher the gas pressure is, the shorter a mean free path of an electron is.

When the velocity distribution of a vapor molecule is expressed by the Maxwell-Boltzmann distribution law, a mean free path λ (cm) of a vapor molecule is expressed by the following equation, $$\lambda = \frac{1}{\sqrt{2}\pi n \sigma^2} \qquad \text{equation 1}$$

wherein n is density of vapor molecules (number of molecules/cm³) and σ is a diameter of a molecule (cm). Since pressure P and density of vapor molecules n are directly proportional at a constant temperature, the following equation holds.

$$\lambda \propto \frac{1}{P} \qquad \text{equation 2}$$

As described above, a mean free path depends on the size of a vapor molecule and decreases with increasing pressure (increasing density of vapor molecules). And, a mean free path of an electron in various vapor is defined to have the 4√2 times value of a mean free path of vapor molecules itself, √2 means the square root of 2).

Figure 13:
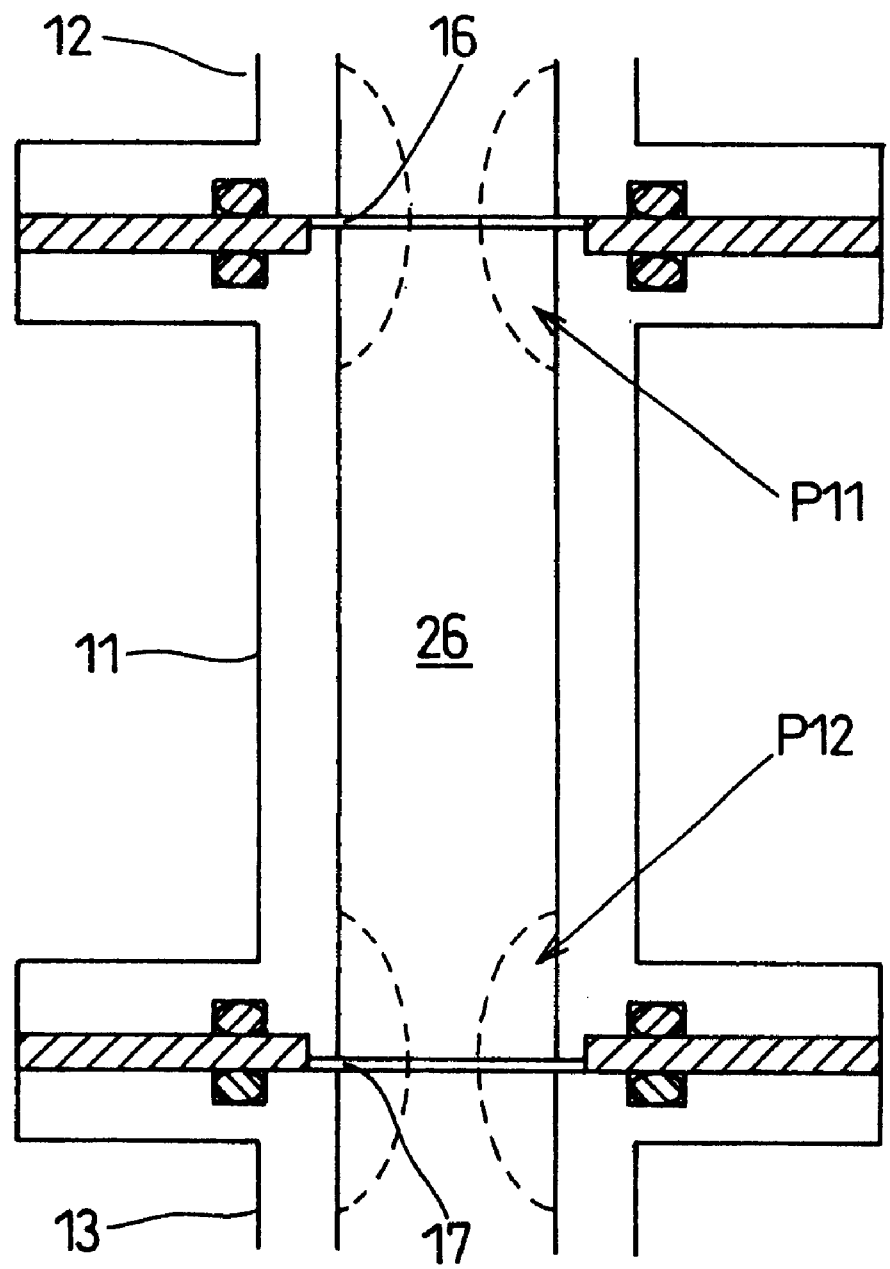
FIG. 13 is a schematic sectional view to point out the problems in the case of being assembled from divided three sections.

As described above, under the high gas pressure, since a mean free path of an electron becomes short, plasma generation will be limited to the vicinity of a discharge gap. FIG. 13 illustrates a condition in which the length of the middle first discharge tube element 11 in the direction becomes large considerably in comparison with the inside diameter of a tube as well as the first, the second, the third and the fifth preferred embodiment. And, FIG. 13 illustrates a condition in which since a plasma generating space 26 is at a high gas pressure, a mean free path of an electron is short and a linkage between a plasma region P11 centered on a discharge gap 16 and a plasma region P12 centered on a discharge gap 17 is lost. That is, plasma is not spreading across the whole of the plasma generating space 26 of the discharge tube. When plasma regions are in conditions of losing such linkage and being separated away, the efficiency of plasma generation becomes extremely low since there is a definite limit on an amount of plasma generated and more increase of plasma generation cannot be expected even though the power applied from a high-frequency power supply 25 is increased.

The present sixth preferred embodiment a high plasma generation efficiency even in high gas pressure which causes a mean free path of an electron to shorten.

Figure 14:
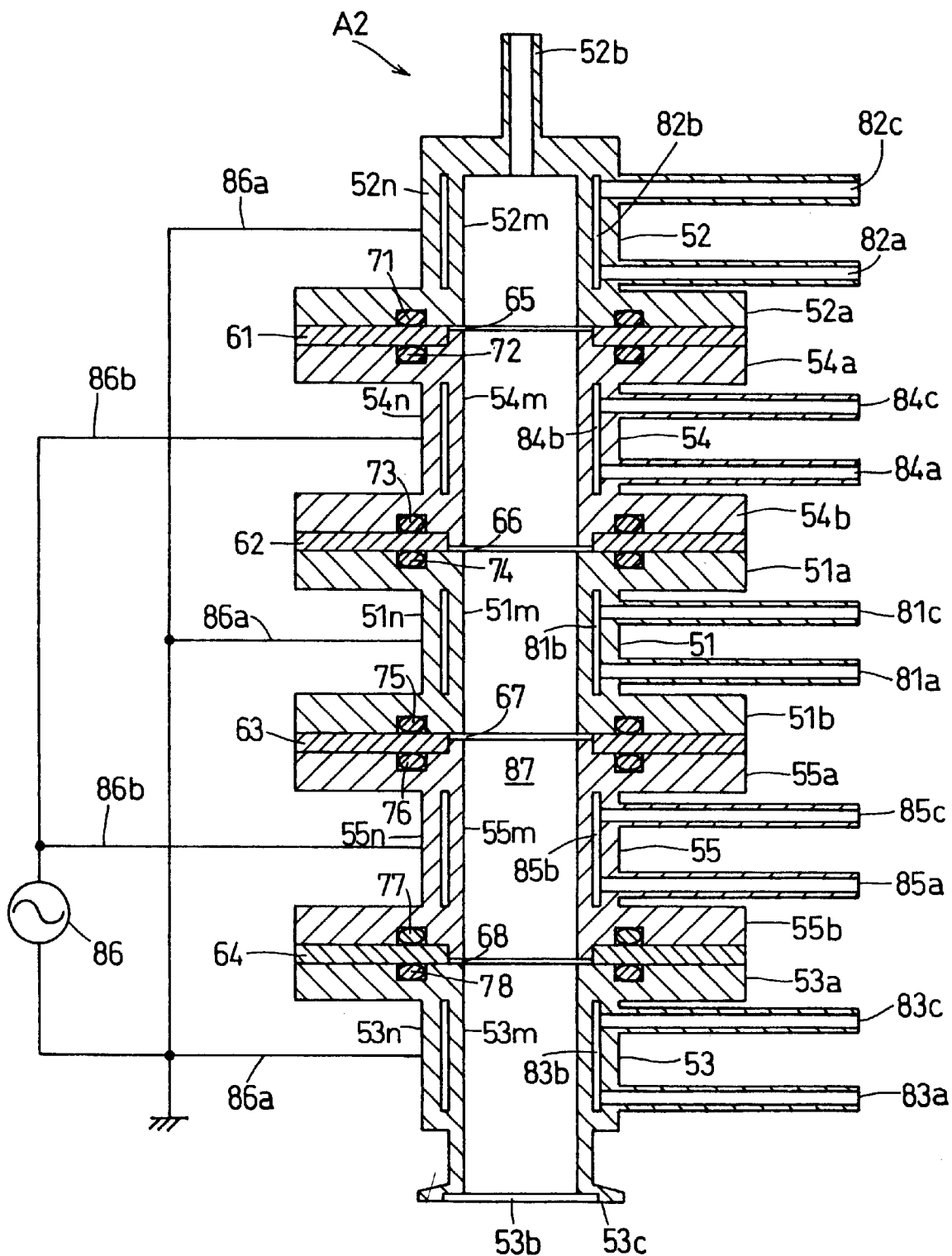
FIG. 14 is a vertical sectional view illustrating schematically a structure of a plasma generating apparatus of a high-frequency discharge type of the sixth preferred embodiment of the present invention.

FIG. 14 is a vertical sectional view illustrating schematically a structure of a plasma generating apparatus of a high-frequency discharge type of the sixth preferred embodiment.

There is a second discharge tube element of metal material denoted by numeral 52 corresponding to an upper second cylindrical discharge tube element formed of metal material, denoted by numeral 12 in FIG. 1 in the first preferred embodiment and also there is a third discharge tube element formed of metal material denoted by numeral 53 corresponding to a lower third cylindrical discharge tube element of metal material, denoted by numeral 13 in FIG. 1. And, a discharge tube element corresponding to the middle first discharge tube element of metal material, denoted by numeral 11 in FIG. 1 in a first preferred embodiment, is divided into three sections in the direction of a tube axis and is made a combination of three discharge tube elements, a middle first discharge tube element of metal material denoted by numeral 51, an intermediate fourth discharge tube element of metal material denoted by numeral 54 and an intermediate fifth discharge tube element of metal material denoted by numeral 55.

Numerals 51a, 51b indicate connecting flanges conjoined integrally to a top end and a bottom end of the middle first discharge tube element 51, numeral 52a a connecting flange conjoined integrally to a bottom end of the second discharge tube element 52, numeral 53a a connecting flange conjoined integrally to a top end of the third discharge tube element 53, numerals 54a, 54b connecting flanges conjoined integrally to top end and bottom end portions of the fourth discharge tube element 54, numerals 55a, 55b connecting flanges conjoined integrally to top end and bottom end portions of a fifth discharge tube element 55, numerals 51m to 55m inner tube portions, numerals 51n to 55n outer tube portions, numerals 61, 62, 63, 64 insulators for forming a discharge gap and vacuum-sealing, numerals 65, 66, 67, 68 discharge gaps, numeral 52b a gas induction port for plasma, numeral 53b a plasma discharge port, numeral 53c a flange for mounting to a device, numerals 71 to 78 O-rings, numerals 81a to 85a cooling medium flow inlet tubes, numerals 81b to 85b cooling medium flow path of waterjacket type, numerals 81c to 85c cooling medium flow outlet tubes and numeral 86 a high-frequency power supply. With respect to these components, matters which are described in first to fifth preferred embodiments and which are not described again in the sixth preferred embodiment are treated as matters which also correspond to the sixth preferred embodiment and the detailed description is omitted.

The connecting flange 51a of a top end side of the first discharge tube element 51 and the connecting flange 54b of a bottom end portion of the fourth discharge tube element 54 support insulator 62 by sandwiching it between both connecting flanges, and furthermore the first discharge tube element 51 is connected coaxially to the fourth discharge tube element 54 with respective O-rings 73, 74 in close contact with insulator 62 and a discharge gap 66 is formed between a top end face of the inner tube portion 51m and an bottom end face of the inner tube portion 54m.

Also, the connecting flange 51b of a bottom end side of the first discharge tube element 51 and the connecting flange 55a of a top end portion of the fifth discharge tube element 55 support insulator 63 by sandwiching it between both connecting flanges, and furthermore the first discharge tube element 51 is connected coaxially to the fifth discharge tube element 55 with respective O-rings 75, 76 in close contact with insulator 63 and a discharge gap 67 formed between a bottom end face of the inner tube portion 51m and a top end face of the inner tube portion 55m.

Further, the connecting flange 54a of a top end side of the fourth discharge tube element 54 and the connecting flange 52a of a bottom end portion of the second discharge tube element 52 support insulator 61 by sandwiching it between both connecting flanges, and furthermore the fourth discharge tube element 54 is connected coaxially to the second discharge tube element 52 with respective O-rings 71, 72 in close contact with insulator 61 and a discharge gap 65 is formed between a top end face of the inner tube portion 54m and a bottom end face of the inner tube portion 52m.

Similarly, the connecting flange 55b of a bottom end side of the fifth discharge tube element 55 and the connecting flange 53a of a top end portion of the third discharge tube element 53 support insulator 64 by sandwiching it between both connecting flanges, and furthermore the fifth discharge tube element 55 is connected coaxially to the third discharge tube element 53 with respective O-rings 77, 78 in close contact with insulator 64 and a discharge gap 68 is formed between a bottom end face of the inner tube portion 55m and a top end face of the inner tube portion 53m.

Thus, the first through the fifth discharge tube elements 51 to 55 are conjoined coaxially and compose one discharge tube A2 assembled from five sections.

Of the two output terminals of a high-frequency power supply 86 used as an energy source of the plasma generation, one terminal is connected to the ground (GND) and set as a grounding terminal 86a, and the other terminal is set as a high voltage terminal 86b. The grounding terminal 86a of a high-frequency power supply 86 is connected to the second discharge tube element 52, the third discharge tube element 53 and the first discharge tube element 51, which are positioned at the upstream end, the downstream end and the middle, respectively, among five discharge tube elements, and the high voltage terminal 86b of the high-frequency power supply 86 is connected to the fourth discharge tube element 54 and the fifth discharge tube element 55 of the rest.

One discharge tube A2 assembled from five sections, which is composed of the first through fifth discharge tube elements 51, 52, 53, 54, 55, takes on a sequential cylindrical tube form, and a gas introduction port for plasma 52b is provided at one end thereof and a plasma discharge port 53b is provided at another end thereof, and the space between the two ends becomes a plasma generating space 87 where gas for plasma generation and plasma flow.

Gas for plasma generation is supplied from the gas introduction port 52b toward the plasma generating space 87 and high-frequency power is supplied to the first through fourth discharge gaps 65, 66, 67, 68, creating a plurality of stages in the vertical direction, and a high-frequency electromagnetic field is generated at the discharge gaps 65, 66, 67, 68 communicating with the plasma generating space 87. Simultaneously, cooling medium is supplied from cooling medium flow inlet tubes 81a to 85a located on the lower side in the first through fifth discharge tube element 51 to 55, respectively, and moves upward in cooling medium flow paths 81b to 85b and flows out from cooling medium flow outlet tube 81c to 85c.

Gas for plasma generation introduced from gas port 52b into the plasma generating space 87 is ignited (fired) at the discharge gaps 65, 66, 67, 68. Once plasma ignition is realized, a chain reaction is promoted by gradually increasing high-frequency power which a high-frequency power supply 86 outputs.

Figure 15:
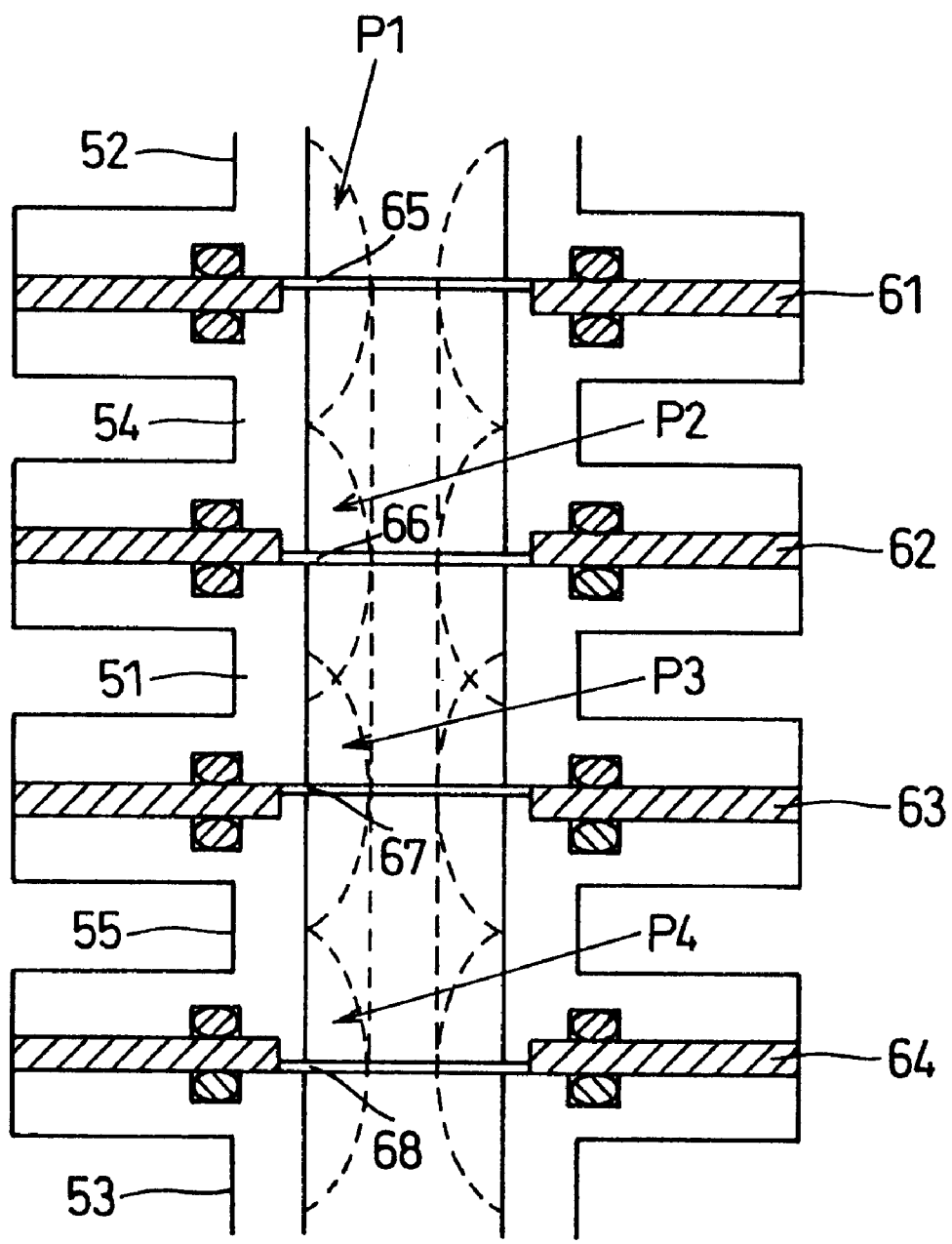
FIG. 15 is a schematic sectional view for illustrating the state of a linkage between plasma regions in a plasma generating apparatus of the sixth preferred embodiment.
Figure 17A:
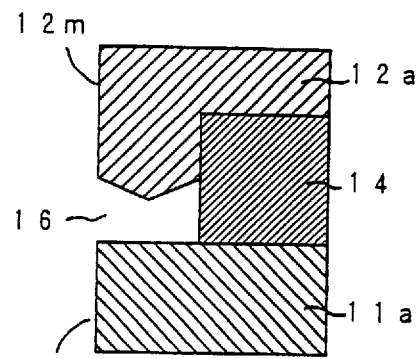
FIG. 17A to FIG. 17H is an enlarged sectional view illustrating under magnification the vicinity of a discharge gap as the preferred embodiment of variations.
Figure 17B:
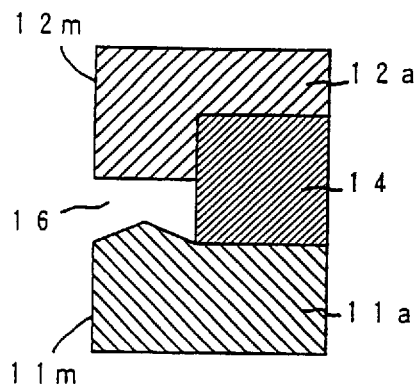
Figure 17C:
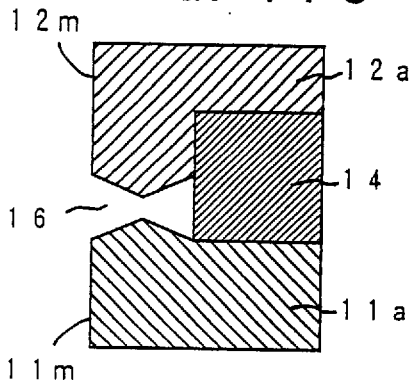
Figure 17D:
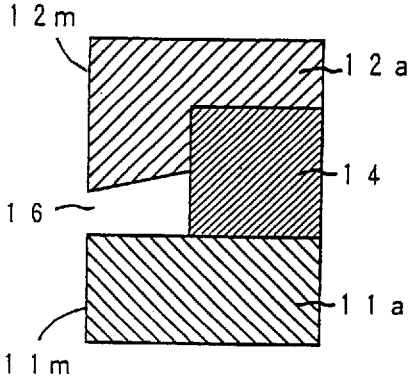
Figure 17E:
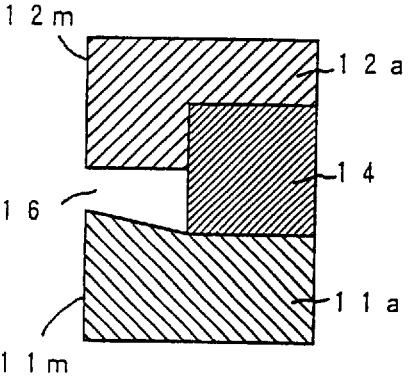
Figure 17F:
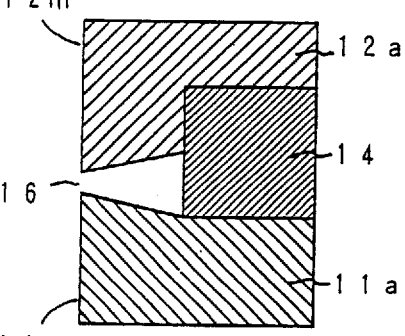
Figure 17G:
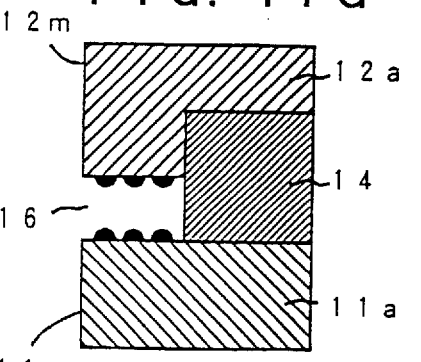
Figure 17H:
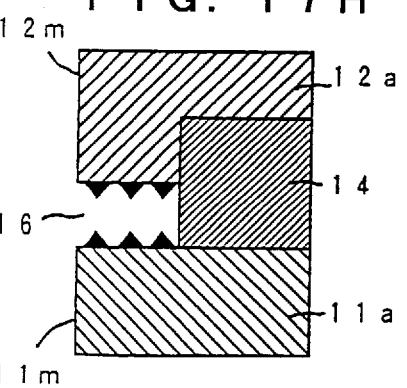
Figure 18:
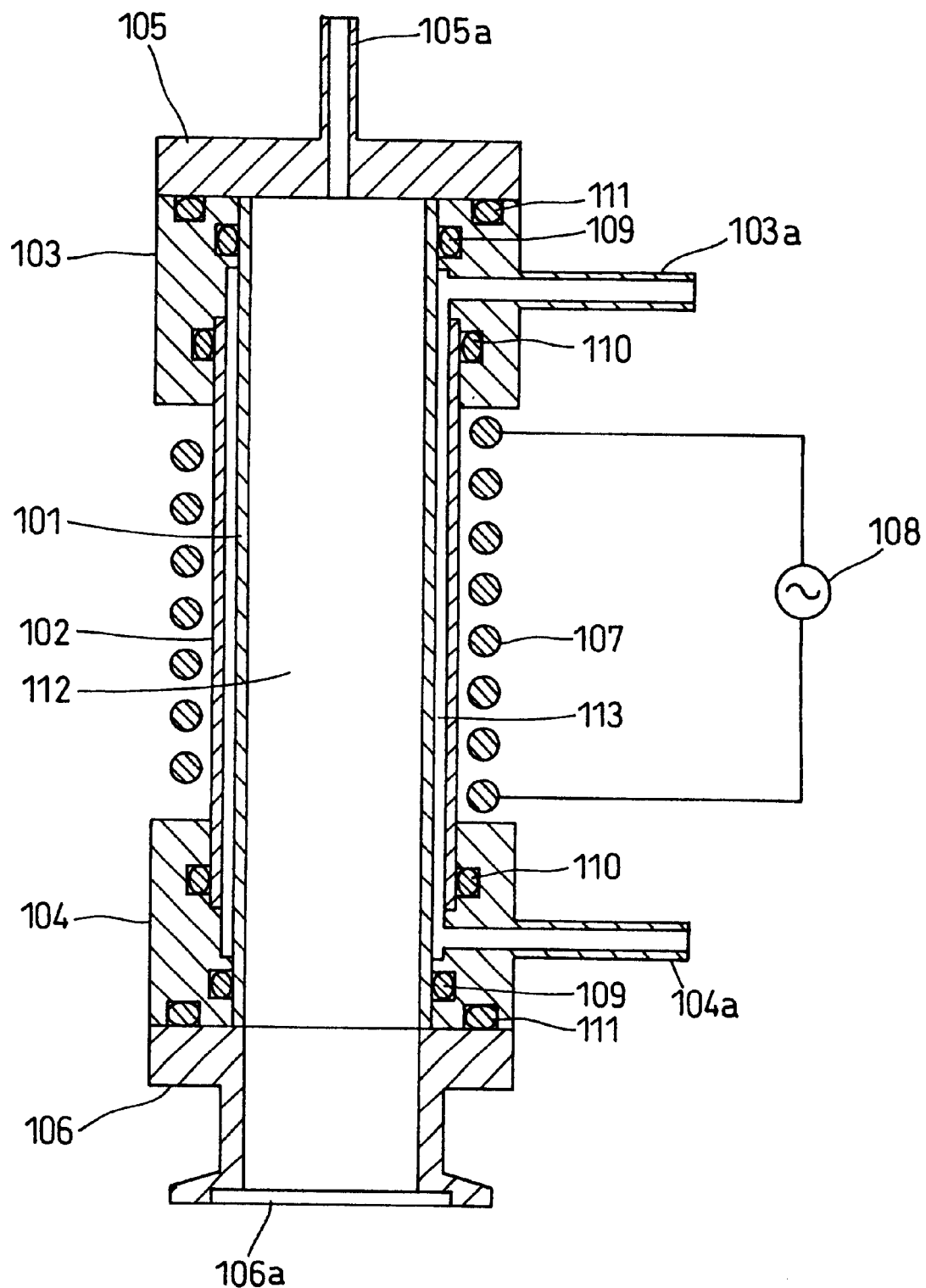
FIG. 18 is a vertical sectional view illustrating schematically a structure of a plasma generating apparatus of an inductive coupling type in accordance with prior art.

As illustrated in FIG. 15, since gas for plasma generation is in a condition of a high gas pressure, a mean free path of an electron is short and holding ranges in the direction of a tube axis of a first plasma region P1 centered on the first discharge gap 65, a second plasma region P2 centered on the second discharge gap 66, a third plasma region P3 centered on the third discharge gap 67 and a fourth plasma region P4 centered on the fourth discharge gap 68, are short. However, the first plasma region P1 and second plasma region P2, which are adjacent in the direction of a tube axis, link together and the second plasma region P2 and third plasma region P3 link together, and further the third plasma region P3 and fourth plasma region P4 link together, and therefore a chain reaction is further advanced and a plasma region is spread across the whole of the plasma generating space 87, and the four plasma regions P1, P2, P3, P4 come to link into one. That is, even in a condition of a high gas pressure, an amount of plasma generated increases, and therefore it is possible to raise the efficiency of power supply and to enhance the efficiency of plasma generation.

Further, though the distance between discharge gaps varies with conditions of plasma generation such as kinds of gas desired to be ionized to plasma, pressure of gas, applied electric power (voltage) and an applied frequency, it is to be set in such a way that plasma generated in the gas region in which it is desired to discharge links together.

In some cases, the distance between discharge gaps may also be set by increasing further the number of division of a discharge tube. In this case, preferably, the number of discharge tube elements is made an odd number by dividing a discharge tube into odd sections. For example, the number of discharge tube elements may also be 7, 9, 11 or the like.

The reason for this is that, as known from a first, a second, a third, a fifth and a sixth preferred embodiments, when an odd number of discharge tube elements are used in connecting a grounding terminal and a high voltage terminal of a high-frequency power supply alternately to a discharge tube element, a grounding terminal of the high-frequency power supply can be connected to an upstream second discharge tube element having a gas induction port for plasma and a downstream third discharge tube element having a plasma discharge port, and therefore it is possible to ensure safety.

Further, a sixth preferred embodiment has been described above as a variation of a first preferred embodiment, but this may be applicable to any type of plasma generating apparatus of a second, a third and a fifth preferred embodiments. And, a fourth preferred embodiment may also be applicable to a sixth preferred embodiment.

A seventh preferred embodiment is one associated with an example of the connection between a discharge tube element and a high-frequency power supply. In the preferred embodiment described above, for example, a grounding terminal and a high voltage terminal of a high-frequency power supply are connected alternately to a discharge tube element as FIG. 1.

However, the present invention is not to be limited to connecting a grounding terminal and a high voltage terminal of a high-frequency power supply alternately to a discharge tube element.

That is, a grounding terminal of a high-frequency power supply may be connected to two or more adjacent discharge tube elements.

One example of another such connection is described referring to FIG. 16A and FIG. 16B.

FIG. 16A and FIG. 16B are views illustrating another example of connection examples between a discharge tube element and a high-frequency power supply, and illustrations of a cooling medium flow path of a discharge tube element, a connecting flange, an insulator and the like are omitted and only the relation of connection between a discharge tube element and a high-frequency power supply is illustrated. Also, a hatched part indicates a discharge tube element connected to a grounding terminal of a high-frequency power supply and an another part (without the hatch lines) indicates a discharge tube element connected to a high voltage terminal of a high-frequency power supply. A reference character G indicates a substantial discharge gap which is capable of plasma ignition. A range of a two-way arrow X1 denotes the distance between discharge gaps and a range of a two-way arrow X2 denotes the distance between discharge gaps required to link plasma regions into one thereby enhancing the plasma generation efficiency.

FIG. 16A and FIG. 16B are examples of connections, for example, in which a discharge tube is divided into ten sections and an upstream second discharge tube element E1 having a gas introduction port for plasma and a downstream third discharge tube element E10 having a plasma discharge port are connected to a grounding terminal of a high-frequency power supply in consideration of a safety standpoint.

Thus, a grounding terminal or a high voltage terminal of a high-frequency power supply may be connected to adjacent two or more discharge tube elements sequentially.

In this case, the levels of a high-frequency power (voltage) applied from a high-frequency power supply becomes the same on the adjacent discharge tube elements. Therefore, plasma ignition will not occur at a discharge gap located at this location. Hence, since the gap is not a discharge gap, a distance X1 between discharge gaps which is capable of plasma ignition is substantially lengthened.

However, when the length of a discharge tube element in the direction of a tube axis is shorter than the distance X2 between discharge gaps required to link plasma regions into one, a distance X1 between discharge gaps which are capable of plasma ignition may also be substantially lengthened by connecting as illustrated in FIG. 16.

As apparent from FIGS. 16A and 16B, when a grounding terminal of a high-frequency power supply is connected to a second discharge tube element E1 and a third discharge tube element E10, the number of discharge gaps capable of plasma ignition becomes an even number even when a grounding terminal or a high voltage terminal of a high-frequency power supply is connected to adjacent two or more discharge tube elements sequentially.

Also, in a seventh preferred embodiment, illustrations of a cooling medium flow path of a discharge tube element, a connecting flange, an insulator and the like are omitted and only the relation of connection between a discharge tube element and a high-frequency power supply is illustrated using FIG. 16A and FIG. 16B, but respective detailed examples may use aspects described in the first through the sixth preferred embodiments.

In any preferred embodiments described above, coating which has high heat-resistant performance may be applied to faces of the inner circumference of the inner tube portions 11m, 12m, 13m or 51m through 55m. As material for the coating, resin which causes less ill effect on substances to be processed such as semiconductor devices may be used.

Further, as a configuration of a discharge gap, various variations like that of FIG. 17A to FIG. 17H are conceivable. A discharge gap having an acute part or a protrusion, and a discharge gap having more acute parts and more protrusions has a higher performance of plasma ignition. And, a discharge gap having a narrow width has a higher performance of plasma ignition.

Moreover, in any preferred embodiments described above, a part of discharge tube elements may also be cooled with air in place of cooling all discharge tube elements with a cooling medium flow.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A plasma generator comprising:
a plurality of tubular members formed of a metallic material and hermetically and serially connected together at ends thereof to form a discharge tube such that discharge gaps are defined between adjacent ones of said tubular members and plasma, is generated in said discharge gaps said discharge tube defining a discharge tube axis;

electrical insulators disposed between adjacent ones of said tubular members to electrically isolated said adjacent ones of said tubular members; and said tubular members being configured to accept application of high frequency power to effect said plasma generation at said discharge gaps.

2. The plasma generator of claim 1 wherein said plurality of tubular members include:
a first discharge tube member disposed at a mid position of said discharge tube;
a second discharge tube member having a gas introduction port and disposed at a first end of said discharge tube; and
a third discharge tube member having a plasma discharge port and disposed at a second end of said discharge tube.

3. The plasma generator of claim 2 further comprising:
a high frequency power supply having a high voltage output and a ground output;
said second and third discharge tube members being connected to said ground output; and
said first discharge tube member being connected to said high voltage output thereby effecting plasma discharge at said discharge gaps defined between said first discharge tube member and said second and third discharge tube members.

4. The plasma generating apparatus of claim 1 wherein said plurality of tubular members include:
a first discharge tube member disposed at a mid portion of said discharge tube;
an second discharge tube member having a gas introduction port and disposed at a first end of said discharge tube;
a third discharge tube member having a plasma discharge port and disposed at a second end of said discharge tube;
a fourth discharge tube member positioned between and interconnecting said first discharge tube member and said second discharge tube member; and
a fifth discharge tube member positioned between and interconnecting said first discharge tube member and said third discharge tube member.

5. The plasma generating apparatus as set forth in claim 4, further comprising:
a high frequency power supply having a high voltage output and a ground output;
said first discharge tube member, said second discharge tube member and said third discharge tube member being connected to said ground output; and
said fourth discharge tube member and said fifth discharge tube member being connected to said high voltage output.

6. The plasma generating apparatus as set forth in claim 1, wherein a total number of said tubular members is an odd number.

7. The plasma generating apparatus as set forth in claim 6, further comprising:
a high frequency power supply having a high voltage output and a ground output;
said tubular members including:
an upstream discharge tube member having a gas introduction port and positioned at a first end of said discharge tube; and a downstream discharge tube member having a plasma discharge port and positioned at a second end of said discharge tube; and said ground output and said high voltage output being connected serially alternately to said discharge tube members such that said ground output is connected to said upstream discharge tube member and said downstream discharge tube member.

8. The plasma generating apparatus as set forth in claim 1, wherein a total number of said discharge gaps for plasma generation is an even number.

9. The plasma generating apparatus as set forth in any of claims 1 to 8, wherein:

said tubular members have flanges at said connected ends, said flanges extend radially outward and are integrally conjoined to said tubular members;

said flanges oppose adjacent ones of said flanges and serve to interconnect said tubular members; and said electrical insulators are respectively interposed between adjacent opposing ones of said flanges.

10. The plasma generating apparatus as set forth in any of claims 1 to 8, wherein said tubular members are independently provided with cooling medium flow paths independent of each other.

11. The plasma generating apparatus as set forth in any of claims 1 to 8, wherein ones of said plurality of said tubular members are provided with cooling medium flow paths and remaining ones of said discharge tube members are cooled with air.

12. The plasma generating apparatus as set forth in any of claims 1 to 8, wherein:

at least one of said adjacent ones of said tubular members define an isolating gap extending from a respective one of said discharge gaps to a respective one of said electrical insulators between said at least one of said adjacent ones of said tubular members; and said isolating gap includes a first part having opposing surfaces extending in a direction perpendicular to said tube axis, and a second part having opposing surfaces extending in a direction parallel to said tube axis.

13. The plasma generating apparatus as set forth in any of claims 1 to 8, wherein said electrical insulators include an outer body portion for vacuum-sealing and an inner protecting portion exposed to plasma.

* * * * *